(12) United States Patent
Laflamme, Jr. et al.

(10) Patent No.: US 7,462,243 B2
(45) Date of Patent: Dec. 9, 2008

(54) CHEMICAL PROCESSING SYSTEM AND METHOD

(75) Inventors: Arthur H Laflamme, Jr., Rowley, MA (US); Jay Wallace, Danvers, MA (US); Eric Strang, Chandler, AZ (US)

(73) Assignee: Tokyo Electron Limited (JP)

( * ) Notice: Subject to any disclaimer, the term of this patent is extended or adjusted under 35 U.S.C. 154(b) by 168 days.

(21) Appl. No.: 11/233,077

(22) Filed: Sep. 23, 2005

(65) Prior Publication Data

US 2006/0090850 A1 May 4, 2006

Related U.S. Application Data

(63) Continuation of application No. PCT/US2004/008872, filed on Mar. 23, 2004.

(60) Provisional application No. 60/457,326, filed on Mar. 26, 2003.

(51) Int. Cl.
  *H01L 21/00* (2006.01)
  *C23C 16/00* (2006.01)
  *C23C 14/00* (2006.01)
(52) U.S. Cl. .............. 118/715; 156/345.33; 156/345.34
(58) Field of Classification Search ............ 118/345.33, 118/345.34, 715; 156/345.33, 345.34
See application file for complete search history.

(56) References Cited

U.S. PATENT DOCUMENTS

| | | | |
|---|---|---|---|
| 6,070,551 A * | 6/2000 | Li et al. ..................... 118/723 I |
| 6,086,677 A | 7/2000 | Umotoy et al. |
| 6,148,761 A | 11/2000 | Majewski et al. |
| 6,302,964 B1 | 10/2001 | Umotoy et al. |
| 2002/0062790 A1 | 5/2002 | Ikeda et al. |
| 2003/0054099 A1 * | 3/2003 | Jurgensen et al. ........ 427/248.1 |
| 2003/0094238 A1 * | 5/2003 | Strang et al. ........... 156/345.48 |

FOREIGN PATENT DOCUMENTS

| | | |
|---|---|---|
| EP | 0 550 058 A2 | 7/1993 |
| WO | WO 98/00576 | 1/1998 |
| WO | WO 00/41212 | 7/2000 |

OTHER PUBLICATIONS

Gary S. Selwyn, "Optical Diagnostic Techniques for Plasma Processing", AVS Monograph Series, Education Committee of American Vacuum Society (New York), M-11, pp. 81-109, (1993).

* cited by examiner

Primary Examiner—Ram N. Kackar

(57) ABSTRACT

A chemical processing system includes a processing chamber containing a chemical processing region and a gas injection system. The gas injection system includes at least one first gas injection orifice and at least one second gas injection orifice in communication with the chemical processing region to expose a substrate to mixed first and second process gases. Other embodiments of the chemical processing system can include a sensor to sense a mixing rate of the process gases or a shroud defining a portion of the at least one first gas injection orifice to control mixing of the process gases. A method of mixing process gas in a chemical processing region of a chemical processing system is provided in which a first process gas and a second process gas are injected into the chemical processing region and mixed. A mixture rate is sensed and used to control the mixing.

44 Claims, 19 Drawing Sheets

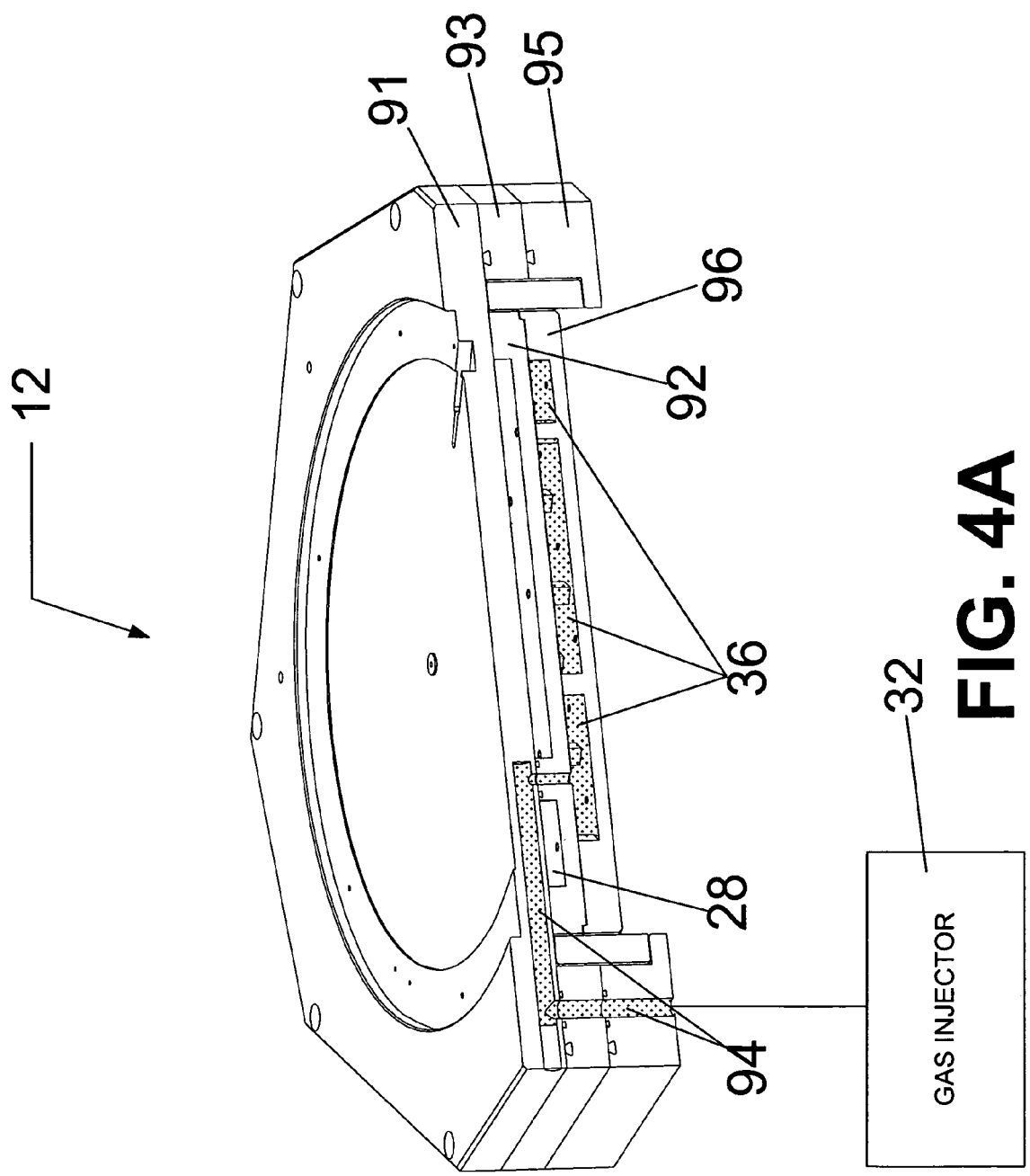

CHEMICAL PROCESSING SYSTEM AND METHOD

This is a continuation of International Application No. PCT/US2004/008872, filed on Mar. 23, 2004, which relies for priority on U.S. Provisional Patent Application No. 60/457,326, filed Mar. 26, 2003, the contents of both of which are incorporated herein by reference in their entireties.

BACKGROUND OF THE INVENTION

1. Field of Invention

The present invention relates to chemical processing and more particularly to mixing process gases used in chemical processing, e.g., chemical oxide removal (COR) processing.

2. Description of Background Information

Chemical processing, such as, for example, chemical oxide removal (COR) processing can be used to alter a mask in an oxide layer which can be used to etch a substrate with feature dimensions, e.g., around 100 nanometers or less. Such chemical oxide removal (COR) processes can include exposing surfaces of the oxide layer to process gases, and heat treating the chemically treated oxide surface layer.

SUMMARY OF THE INVENTION

One aspect of the invention is to provide a chemical processing system comprising a processing chamber containing a chemical processing region and a gas injection system configured to inject first and second process gases into the chemical processing region. The gas injection system comprises a first process gas injector and a second process gas injector. The first process gas injector includes at least one first gas injection orifice therein in communication with the chemical processing region. The first process gas injector is configured to inject the first process gas into the chemical processing region through the at least one first gas injection orifice to allow exposure of a substrate to the first process gas. The second process gas injector includes at least one second gas injection orifice therein in communication with the chemical processing region. The second process gas injector is configured to inject the second process gas into the chemical processing region through the at least one second gas injection orifice to allow exposure of the substrate to the second process gas. The first and second gas injection orifices are angled relative to each other.

Another aspect of the invention is to provide a chemical processing system comprising a processing chamber containing a chemical processing region and a gas injection system configured to inject first and second process gases into the chemical processing region. The gas injection system comprises a gas distribution assembly that includes a first gas distribution plate and a second gas distribution plate. The first gas distribution plate defines a first gas injection plenum and a first plurality of gas injection orifices therein. The first gas injection plenum and the first plurality of gas injection orifices are in communication with the chemical processing region. The second gas distribution plate defines a second gas injection plenum and a second plurality of gas injection orifices therein. The second gas injection plenum and the second plurality of gas injection orifices are in communication with the chemical processing region. The first gas injection plenum is configured to receive the first process gas and the second gas injection plenum is configured to receive the second process gas such that exposure of a substrate positioned within the chemical processing region to the mixed first and second process gases can be effected through the first and second pluralities of gas injection orifices. At least one of the first plurality of gas injection orifices and at least one of the second plurality of gas injection orifices are angled relative to each other.

Yet another aspect of the invention is to provide a chemical processing system comprising a processing chamber containing a chemical processing region and a gas injection system configured to inject first and second process gases into the chemical processing region. The gas injection system comprises a gas distribution assembly that includes a first gas injector and a second gas injector. The first gas injector includes at least one first gas injection orifice therein in communication with the chemical processing region. The second gas injector includes at least one second gas injection orifice therein in communication with the chemical processing region. The first gas injector is configured to receive the first process gas and the second gas injector is configured to receive the second process gas such that exposure of a substrate positioned within the chemical processing region to the mixed first and second process gases can be effected through the first and second gas injection orifices. A shroud is provided in communication with the chemical processing region. The shroud defines a portion of the at least one first gas injection orifice. The shroud can be movable to adjust a degree of mixing of the first and second process gases.

Still another aspect of the invention is to provide a chemical processing system comprising a processing chamber containing a chemical processing region and a gas injection system configured to inject first and second process gases into the chemical processing region. The gas injection system comprises a first process gas injector including at least one gas injection orifice in communication with the chemical processing region and a second process gas injector including at least one second gas injection orifice in communication with the chemical processing region. The first process gas injector is configured to inject the first process gas into the chemical processing region to allow exposure of the substrate to the first process gas and the second process gas injector is configured to inject the second process gas into the chemical processing region to allow exposure of the substrate to the second process gas. A sensor configured to sense a mixing rate of the first and second process gases within the chemical processing region is provided.

Another aspect of the invention is to provide a method of mixing process gas in a chemical processing region of a chemical processing system. The chemical processing system includes a processing chamber containing the chemical processing region. The method comprises injecting a first process gas and a second process gas into the chemical processing region. Mixing of the first and second process gases is effected at or substantially proximate a substrate positioned within the chemical processing region. A mixture rate of the first process gas and the second process gas is sensed and control of the mixing is based on the sensed mixture rate. The mixing process can be controlled in real time.

BRIEF DESCRIPTION OF THE DRAWINGS

The accompanying drawings, which are incorporated in and constitute a part of the specification, of embodiments of the invention, together with the general description given above and the detailed description of the embodiments given below, serve to explain the principles of the invention wherein:

FIG. 4A is a perspective view of the first embodiment of a gas injection system in accordance with the principles of the invention, which shows a gas distribution system with certain portions removed to show a second gas distribution plenum in detail;

DETAILED DESCRIPTION OF EMBODIMENTS

Figure 1:
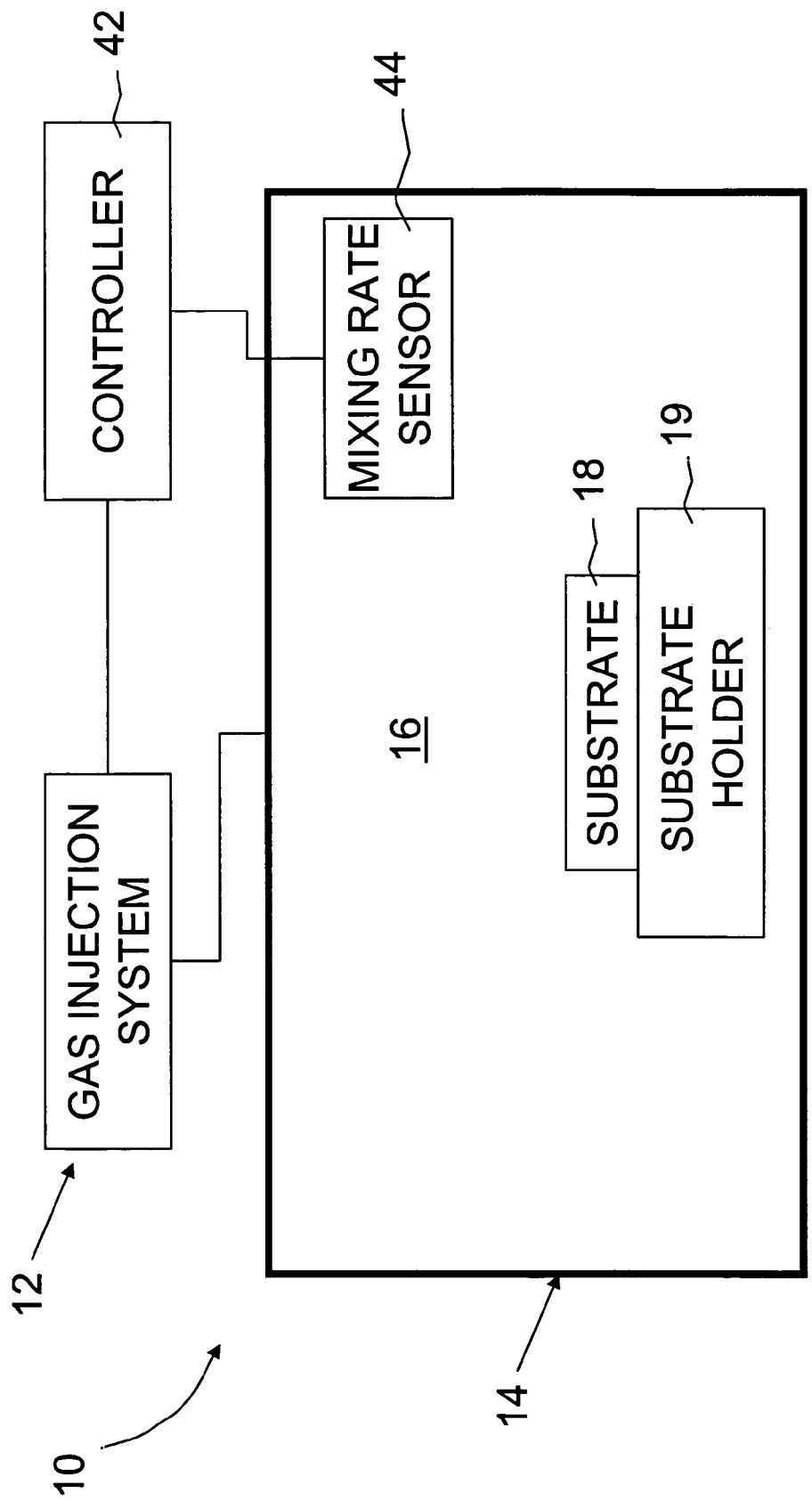
FIG. 1 is a schematic view of a chemical processing system in accordance with the principles of the invention, showing a processing chamber containing a chemical processing region in communication with a gas injection system.
Figure 2:
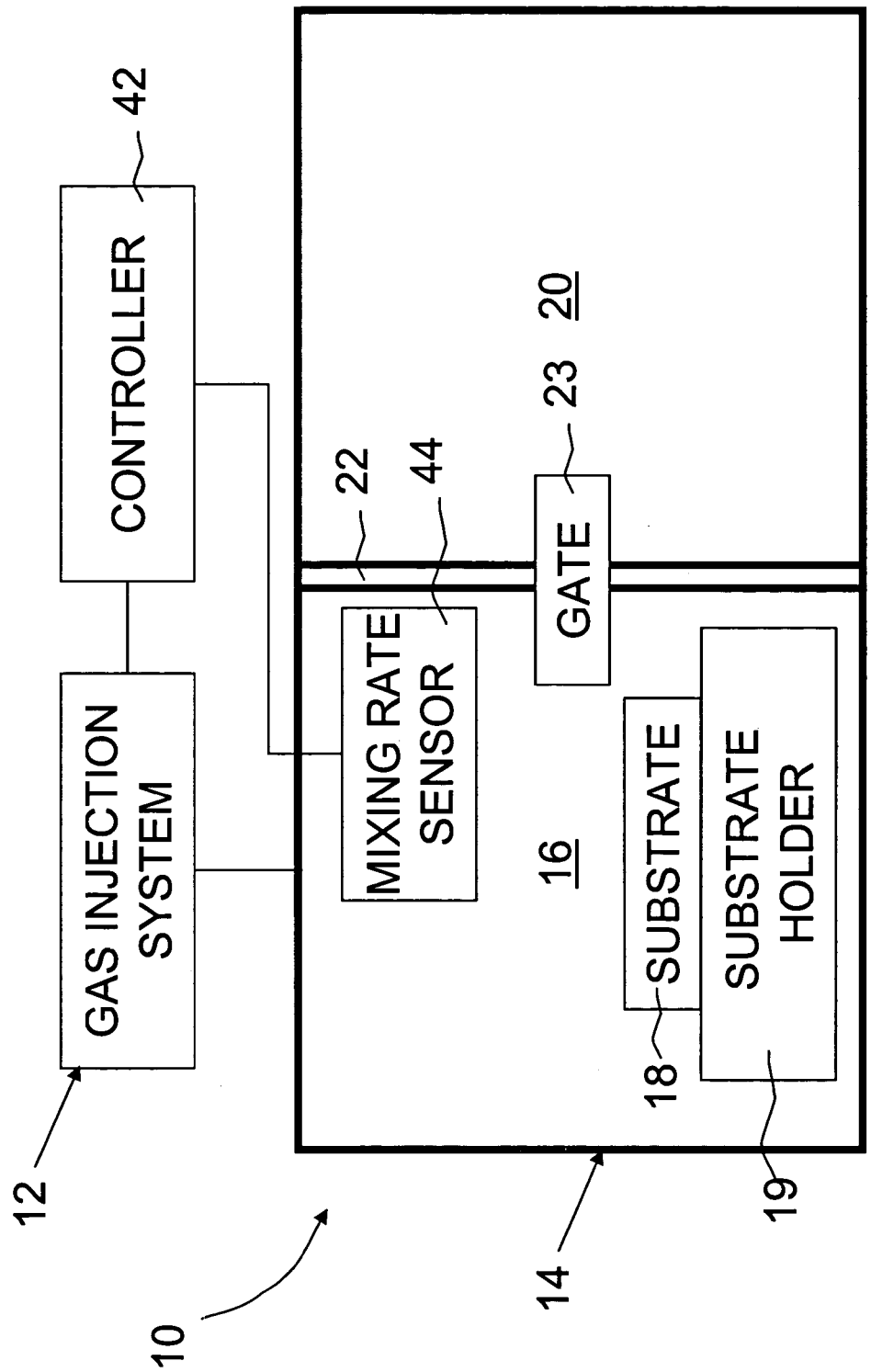
FIG. 2 is a schematic view of a chemical processing system in accordance with the principles of the invention, showing a processing chamber containing a chemical processing region and a heat treatment region in communication with a gas injection system.

FIGS. 1 and 2 show embodiments of a chemical processing system according to principles of the invention. The chemical processing system is illustrated as a chemical oxide removal system, generally indicated at 10, and is in communication with a gas injection system 12. In FIG. 1, the chemical processing system 10 includes a processing chamber 14 defining a chemical processing region 16 in communication with the gas injection system 12. The temperature of the chemical processing region 16 can be controlled. A substrate 18 can be positioned within the chemical processing region 16 to be processed, e.g., on a substrate holder 19. The substrate 18 can be a semiconductor wafer, having an oxide layer thereon, to be patterned to provide a mask to form a gate electrode when selected portions of the oxide layer are removed through a chemical process and a heating process, for example. The processing chamber 14 can be hermetically sealed and can be formed from aluminum or another suitable material, such as an anodized material to form a protective layer thereon.

In FIG. 2, the processing chamber 14 defines the chemical processing region 16 and a heat treatment region, generally indicated at 20. The heat treatment region 20 is a temperature controlled region positioned in communication with the chemical processing region 16. A heat insulator 22 and a gate 23 can be positioned between the chemical processing region 16 and the heat treatment region 20 to help isolate and insulate the chemical processing region 16 from the heat treatment region 20. The gate 23 can provide access between the chemical processing region 16 and the heat treatment region 20, for example, for a transfer mechanism (not shown) to transfer the substrate 18 from the substrate holder 19 in the chemical processing region 16 to the heat treatment region 20. Although the heat treatment region 20 is shown as part of the processing chamber 14 in FIG. 2, the heat treatment region 20 can also be provided as a separate chamber from the chemical processing region 16. Alternatively, chemical and heat processing can occur in the same space.

The gas injection system 12 is coupled to the chemical processing region 16 to introduce process gases into the chamber 14 for chemically treating the substrate 18, regardless of which configuration of the processing chamber 14 is implemented. The process gases can be selected according to the desired application as understood by one skilled in the art and can be hydrogen fluoride and ammonia, for example, although other gases can be used. For example, a carrier gas can be added to one or more of the process gases. The carrier gas can, for example, comprise an inert gas such as helium, argon, or xenon.

Figure 3A:
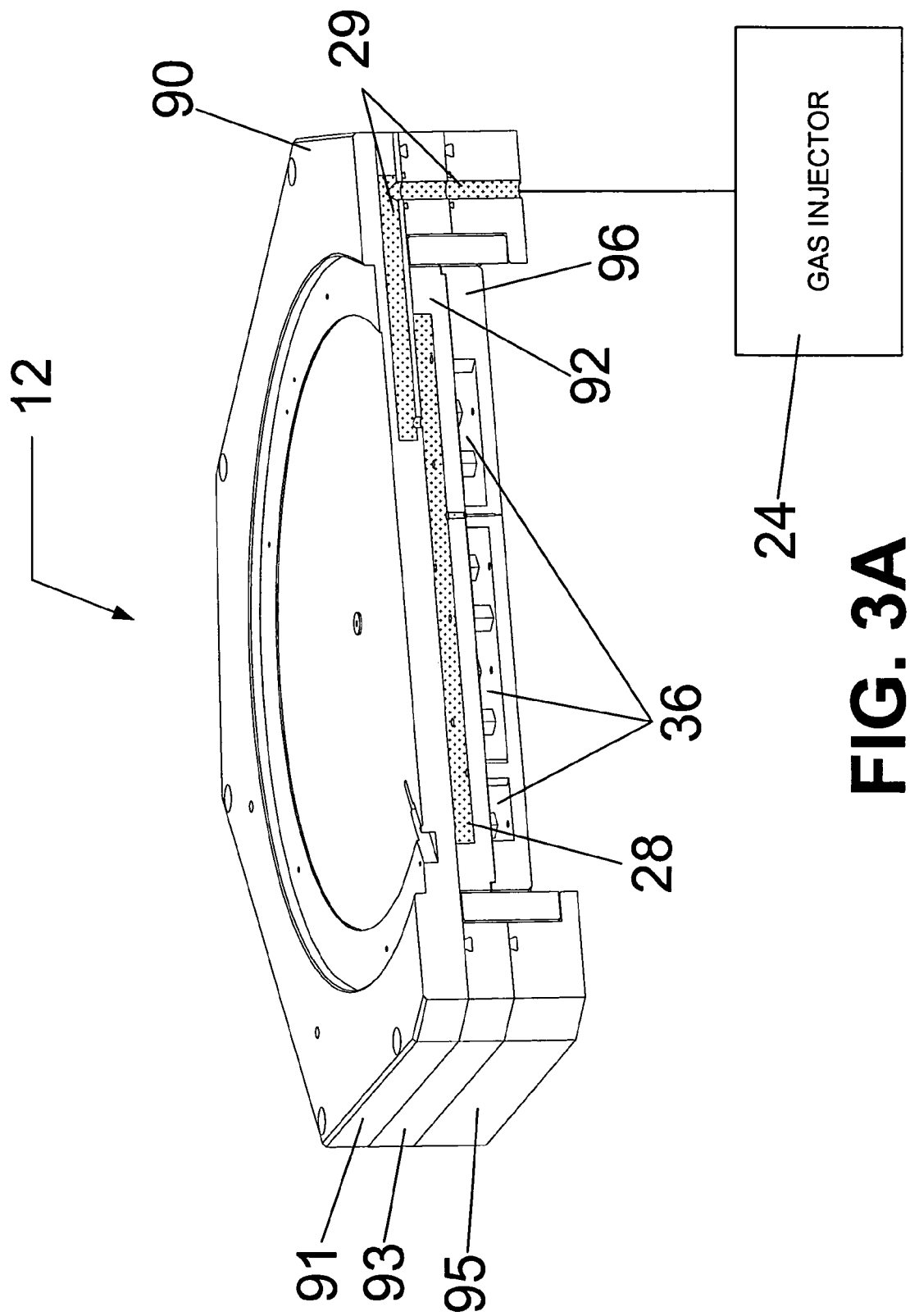
FIG. 3A is a perspective view of a first embodiment of a gas injection system in accordance with the principles of the invention, which shows a gas distribution system with certain portions removed to show a first gas distribution plenum in detail.
Figure 4B:
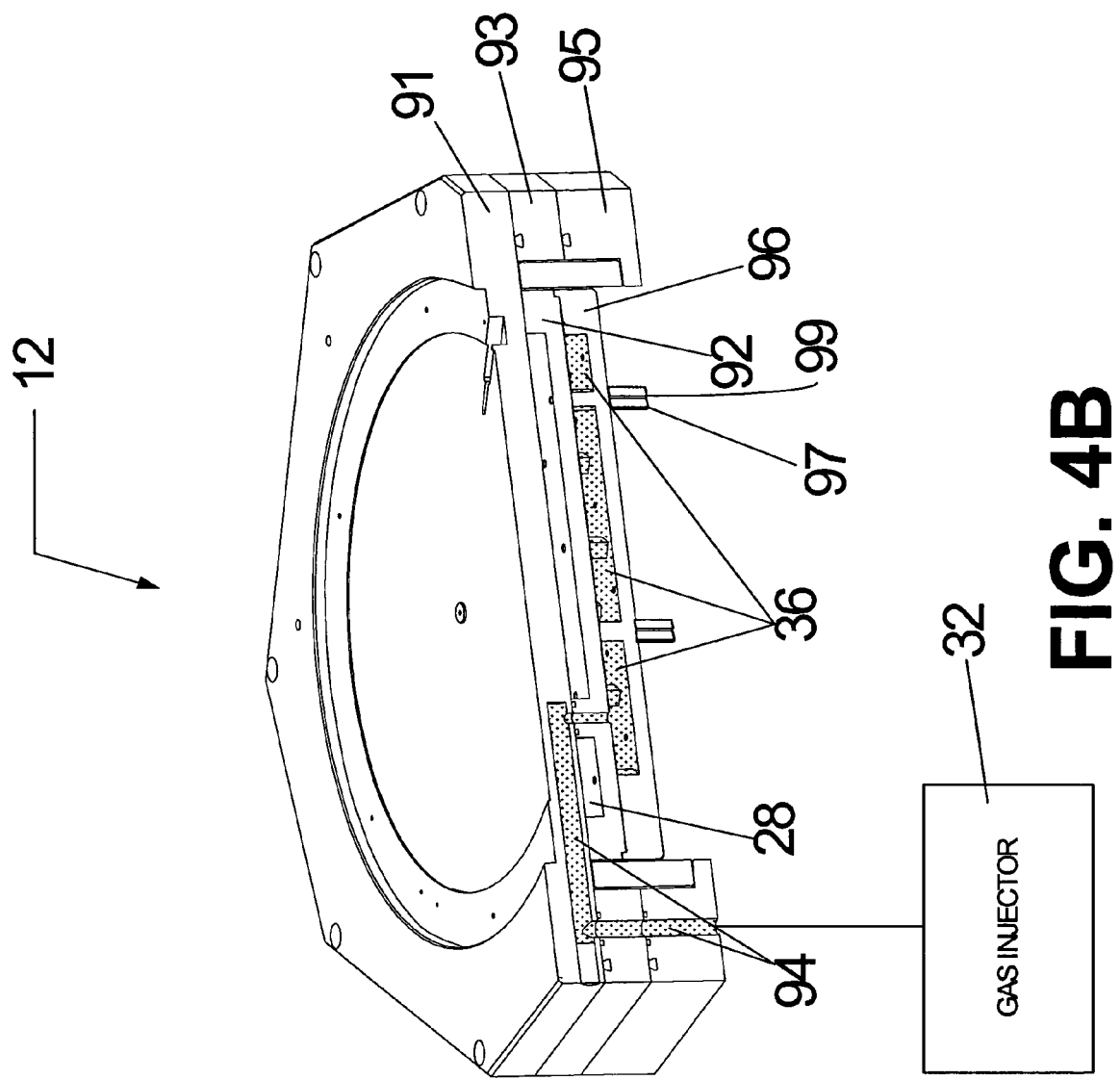
FIG. 4B is a perspective view of the second embodiment of a gas injection system in accordance with the principles of the invention, which shows a gas distribution system with certain portions removed to show a second gas distribution plenum in detail.
Figure 5A:
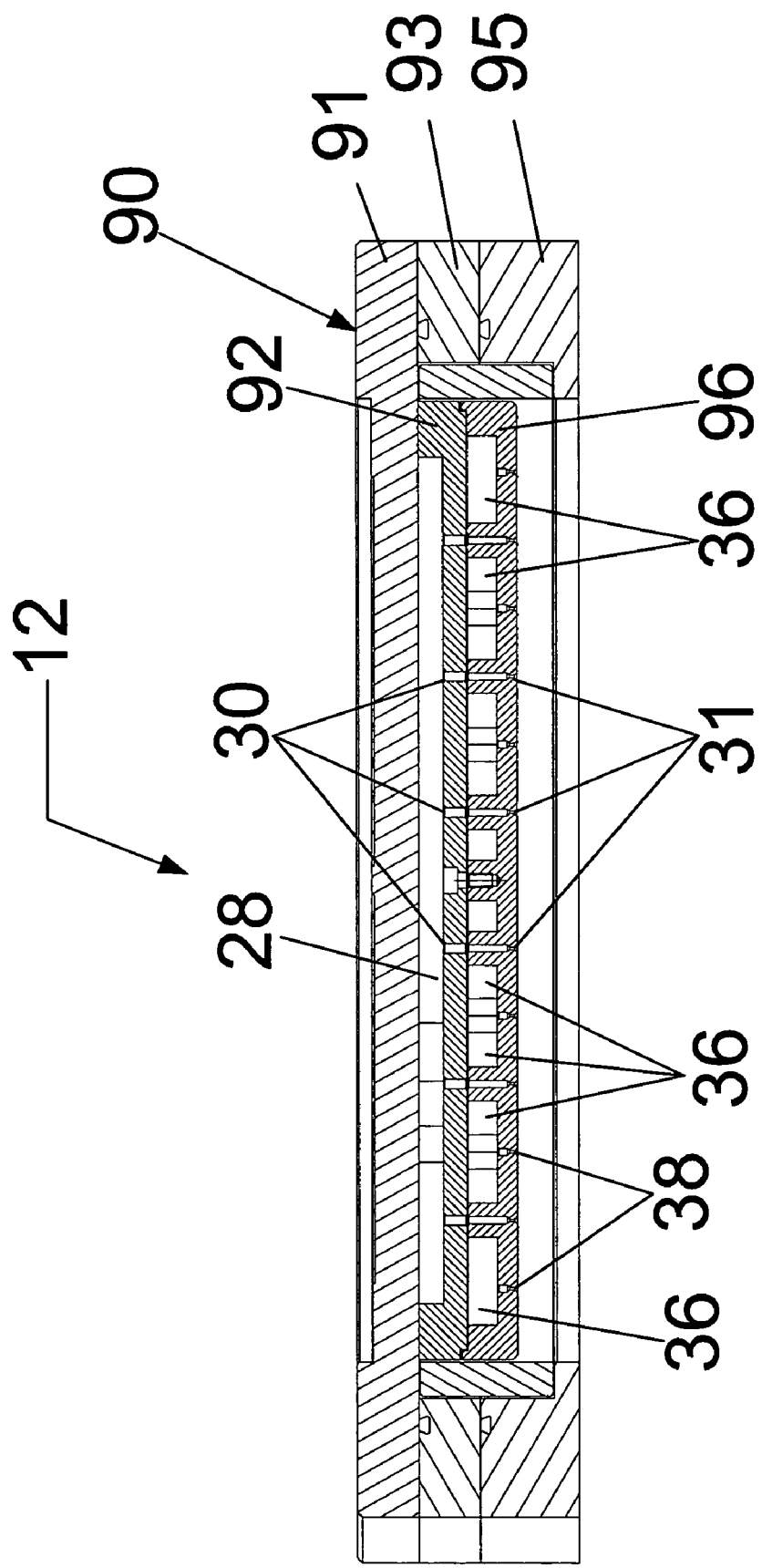
FIG. 5A is a diagrammatic cross section of the gas injection system shown in FIGS. 3A and 4A.
Figure 6A:
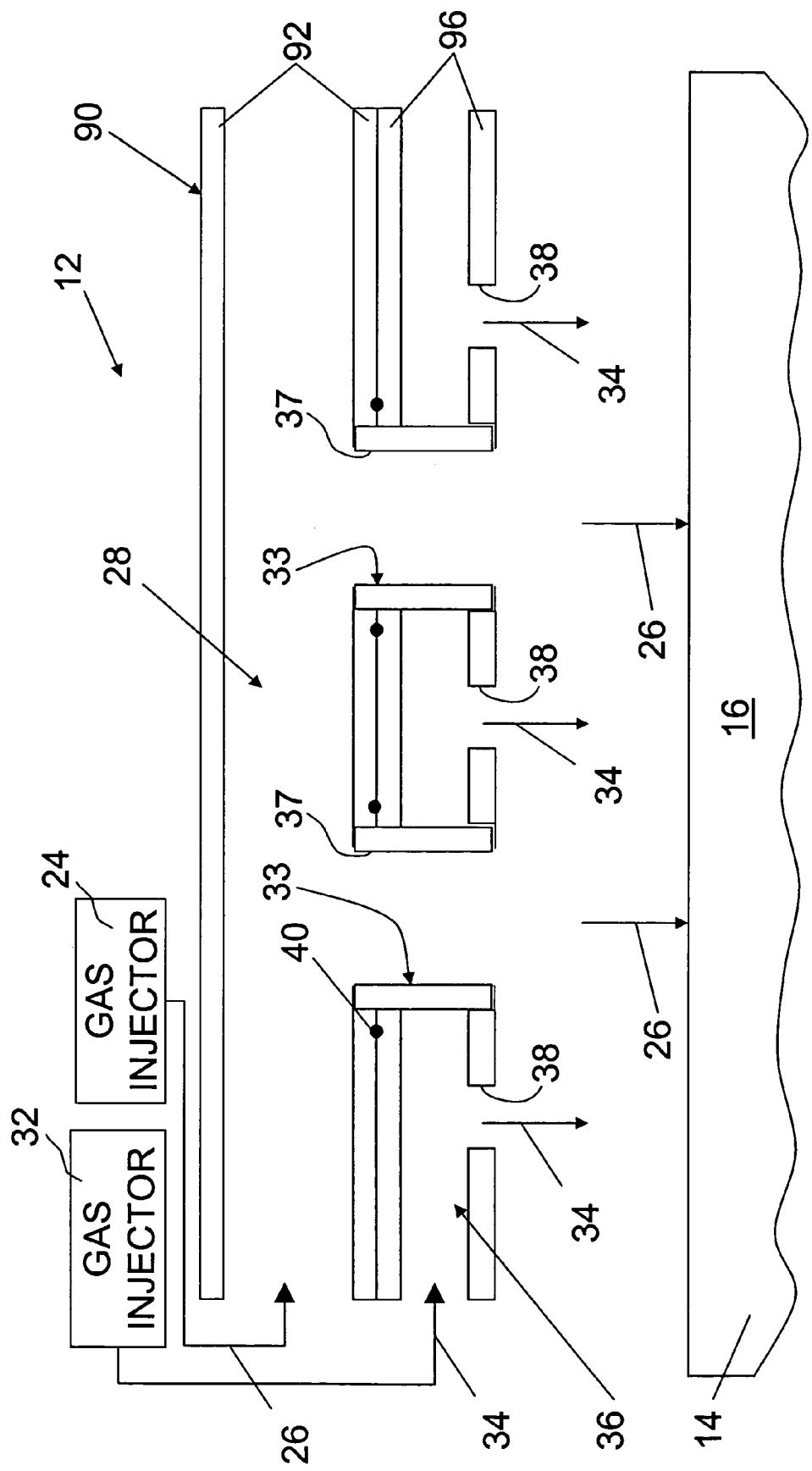
FIG. 6A is an enlarged view of a portion of the gas injection system of a third embodiment similar to that shown in FIGS. 3A, 4A and 5A.

FIGS. 3A, 4A and 5A show one embodiment of the gas injection system 12 in greater detail and FIG. 6A shows an enlarged view of a portion of the gas injection system 12 positioned relative to the chemical processing region 16 of the processing chamber 14 in an embodiment similar to that shown in FIGS. 3A, 4A and 5A.

As illustrated, the gas injection system 12 includes a gas distribution assembly 90 including first and second gas distribution plates 92, 96 and a first gas injector 24 configured to inject or introduce a supply of first process gas 26 into a first gas injector plenum 28 of the gas distribution assembly 90 through a first gas supply passageway 29. The first process gas 26 can include hydrogen fluoride, ammonia or other process gas capable of processing a semiconductor wafer, for example. The first process gas 26 can further include a carrier gas. The first gas injector plenum 28 and the first gas supply passageway 29 connect the gas injector 24 to the chemical processing region 16. As a result, the first process gas 26 injected or introduced into the first gas injector plenum 28 is also injected or introduced into the chemical processing region 16.

The first gas distribution plate 92 can define a first plurality of gas injection orifices 30. Each gas injection orifice 30 is illustrated as an elongated cylindrical passage. Each gas injection orifice 30 has a surface 31 comprised of a first portion that extends from the first gas injector plenum 28 through the first gas distribution plate 92 and a second portion that extends through the second gas distribution plate 96. In this manner, the surface 31 of each gas injection orifice 31 is in communication with the chemical processing region 16 so that the first process gas 26 can pass therethrough into the chemical processing region 16. In FIG. 6A, orifices 37, which are substantially similar to orifices 30 described above, have a surface 33 that extends from the first gas injector plenum 28 through the first gas distribution plate 92 and the second gas distribution plate 96. Surface 33 is similar in operation to the first and second portions of surface 31 described above.

The gas injection system 12 also includes a second gas injector 32 configured to inject or introduce a supply of second process gas 34 into a second gas injector plenum 36 of the gas distribution assembly 90 through a second gas supply passageway 94. The second process gas 34 can include hydrogen fluoride, ammonia or other process gas capable of processing a semiconductor wafer. The second process gas 34 can further comprise a carrier gas. The second gas injector plenum 36 and the second supply passage 94 connect the gas injector 32 to the chemical processing region 16. As a result, second process gas 34 that is injected or introduced into the second gas injector plenum 36 is also injected or introduced into the chemical processing region 16.

The second gas distribution plate 96 can define a second plurality of gas injection orifices 38. Each gas injection orifice 38 extends from the second gas injector plenum 36 through the second gas distribution plate 96 to communicate with the chemical processing region 16 so that the second process gas 34 can pass therethrough into the chemical processing region 16.

The gas distribution assembly 90 can be formed of a plurality of components 91, 93, 95 coupled to one another with suitable fasteners and vacuum seals where necessary. Alternatively, the gas distribution assembly 90 can be formed as a single piece.

Figure 3B:
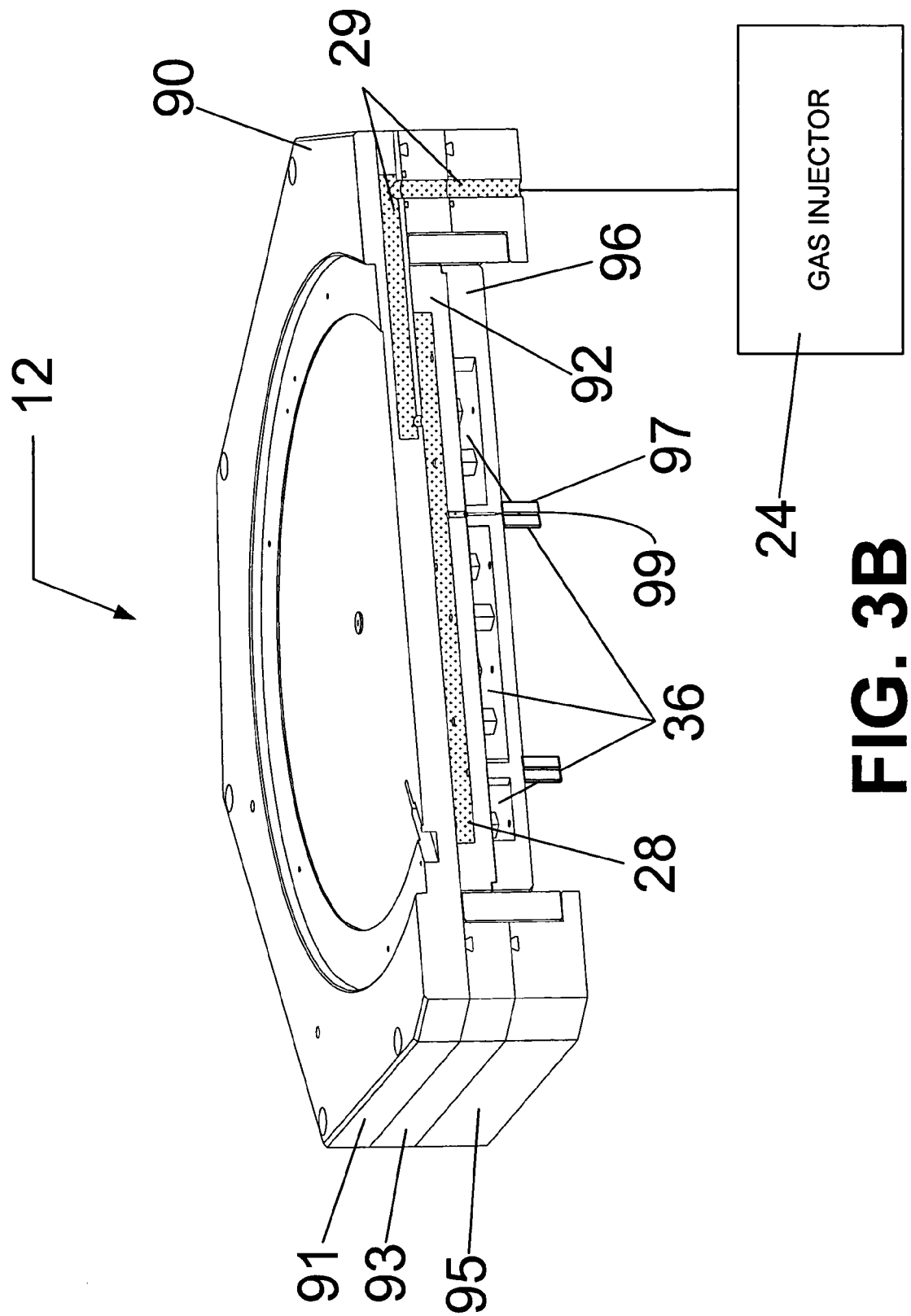
FIG. 3B is a perspective view of a second embodiment of a gas injection system in accordance with the principles of the invention, which shows a gas distribution system with certain portions removed to show a first gas distribution plenum in detail.
Figure 5B:
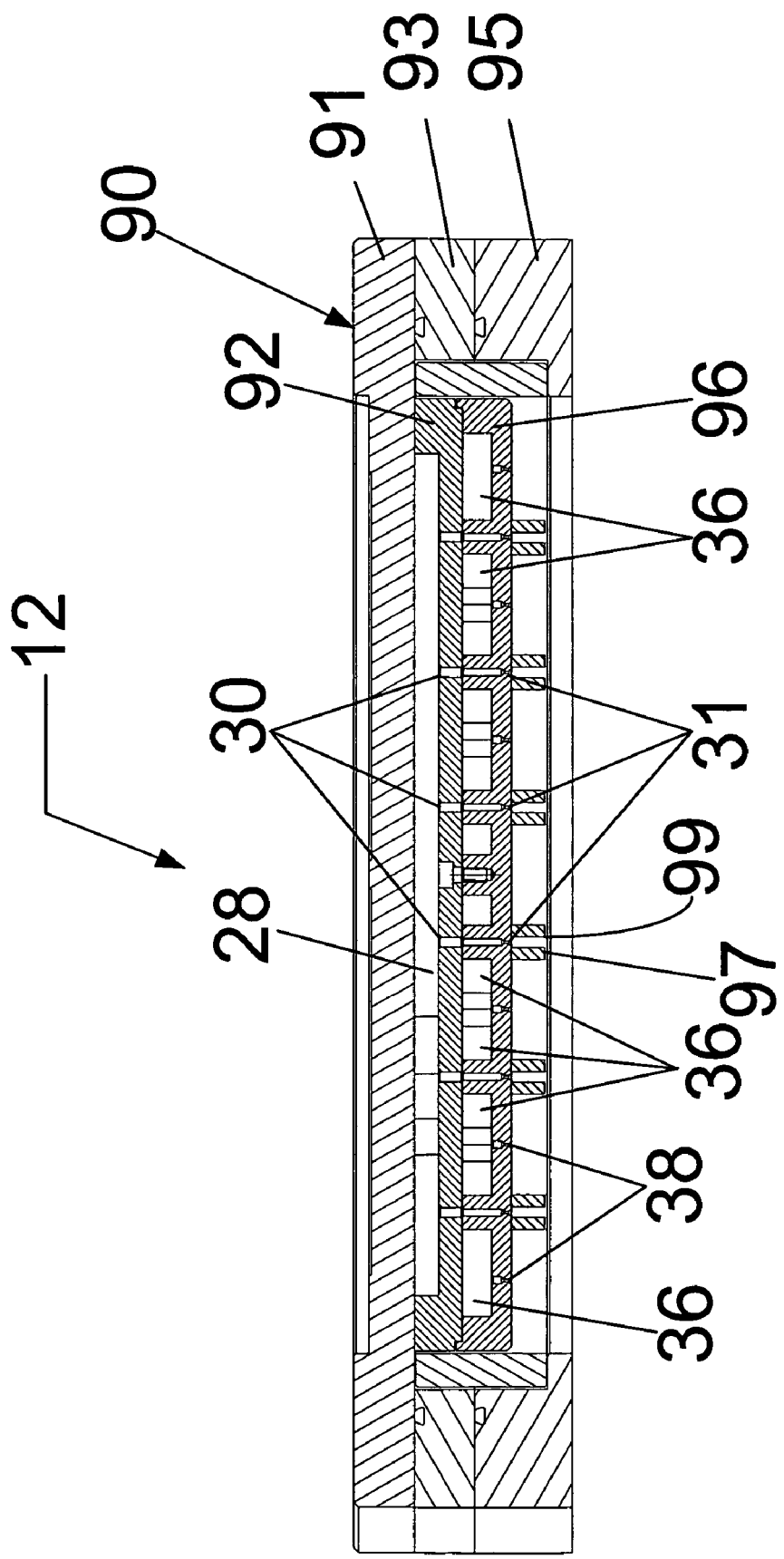
FIG. 5B is a diagrammatic cross section of the gas injection system shown in FIGS. 3B and 4B.
Figure 6B:
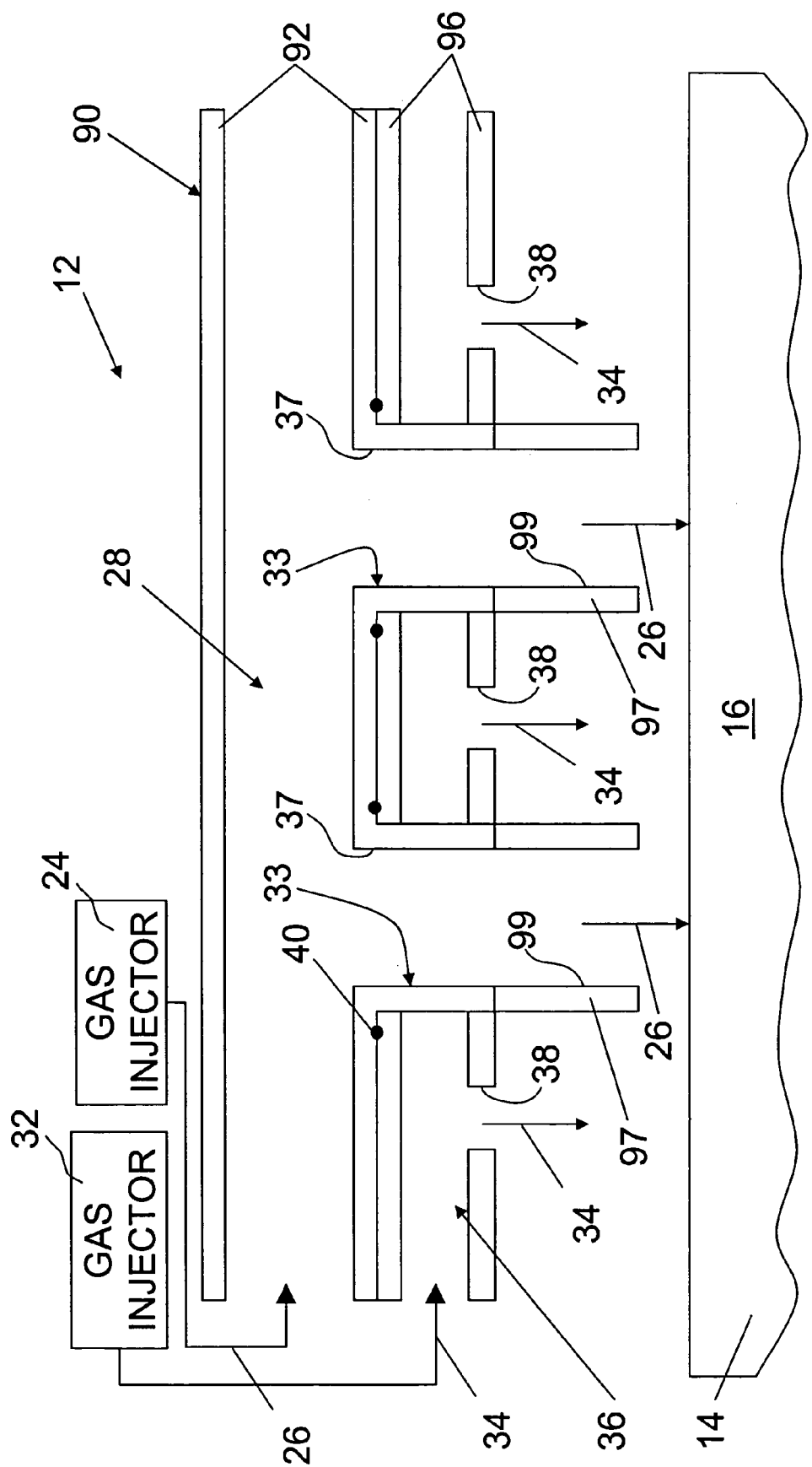
FIG. 6B is an enlarged view of a portion of the gas injection system of a fourth embodiment similar to that shown in FIGS. 3B, 4B and 5B.

FIGS. 3B, 4B and 5B show another embodiment of the gas injection system 12 in greater detail and FIG. 6B shows an enlarged view of a portion of the gas injection system 12 positioned relative to the chemical processing region 16 of the processing chamber 14 in an embodiment similar to that shown in FIGS. 3B, 4B and 5B.

FIGS. 3B, 4B, 5B, and 6B show external shrouds 97 each of which is coupled to the second gas distribution plate 96 to further separate the first and second process gases 24, 36. Each shroud 97 includes a surface 99 which serves as an extension to the second portion of the surface 31 shown in FIGS. 3B, 4B and 5B when the shrouds 97 are coupled to the first gas distribution plate 92. The surface 99 of each shroud 97 and a corresponding portion of the surface 31 can be formed as one surface. For example, either the gas distribution plate 92 or the shroud 97 can extend from the first gas distribution plenum 28 through the second gas distribution plate 96.

In FIG. 6B, orifices 37, which are substantially similar to orifices 30 described above, have surface 33 that extends from the first gas injector plenum 28 through the first gas distribution plate 92 and the second gas distribution plate 96. Surface 33 is similar in operation to the first and second portions surface 31 described above. The extending surface 99 of each shroud 97 and surface 33 can be formed as one surface.

As shown in FIGS. 6A and 6B, the first gas distribution plate 92 to the second gas distribution plate 96, for example, by fasteners 40. As illustrated, the first and second gas injector plenums or passageways 28, 36, which can be substantially cylindrical, are fixedly or releasably secured to one another, for example, when the first and second gas distribution plates 92, 96 are coupled by fasteners 40. The fasteners 40 can be any fastener capable of fixedly or releasably securing the first and the second gas distribution plates 92, 96 together or to the processing chamber 14. The fasteners 40 can include screws, nuts and bolts, rivets and other fasteners, for example. The fasteners 40 can also be used to coupled the gas distribution assembly 90 to the processing chamber 14. Alternatively, the first and second gas distribution plates 92, 96 can be separately mounted to the processing chamber 14, for example, by fasteners 40. Additionally, the first and second gas distribution plates 92, 96 can be coupled to one another with seals such as elastomer O-rings or polytetraflouethylene gaskets. The fasteners and seals can be eliminated if distribution plates 92, 96 are attached by brazing, welding or the like.

A controller 42 (FIGS. 1 and 2) can be coupled to the chemical processing region 16 and can be configured to generate control voltages sufficient to communicate and activate inputs to chemical processing system 10 as well as configured to monitor monitoring outputs from the chemical processing system 10. For example, the controller 42 can be coupled to a sensor 44 coupled to the chemical processing region 16 (FIGS. 1 and 2) to exchange information therewith. The sensor 44 is configured to obtain mixing information on first and second process gases 26, 34 as described in further detail below. A program, which can be stored in a memory, can be utilized to control the mixing according to mixing information, e.g., mixing rate or concentrations of first and second process gases, obtained by the sensor. Furthermore, controller 42 is capable of controlling the components of the gas injection system 12. For example, the controller 42 can be configured to control the first and second gas injectors 24, 30, respectively. Alternatively, multiple controllers 42 can be provided, each of which being configured to control different components of either the chemical processing system 10 or the process gas injection system 12, for example. One example of the controller 42 is a DELL PRECISION WORKSTATION 610™, available from Dell Corporation, Austin, Tex.

Figure 7:
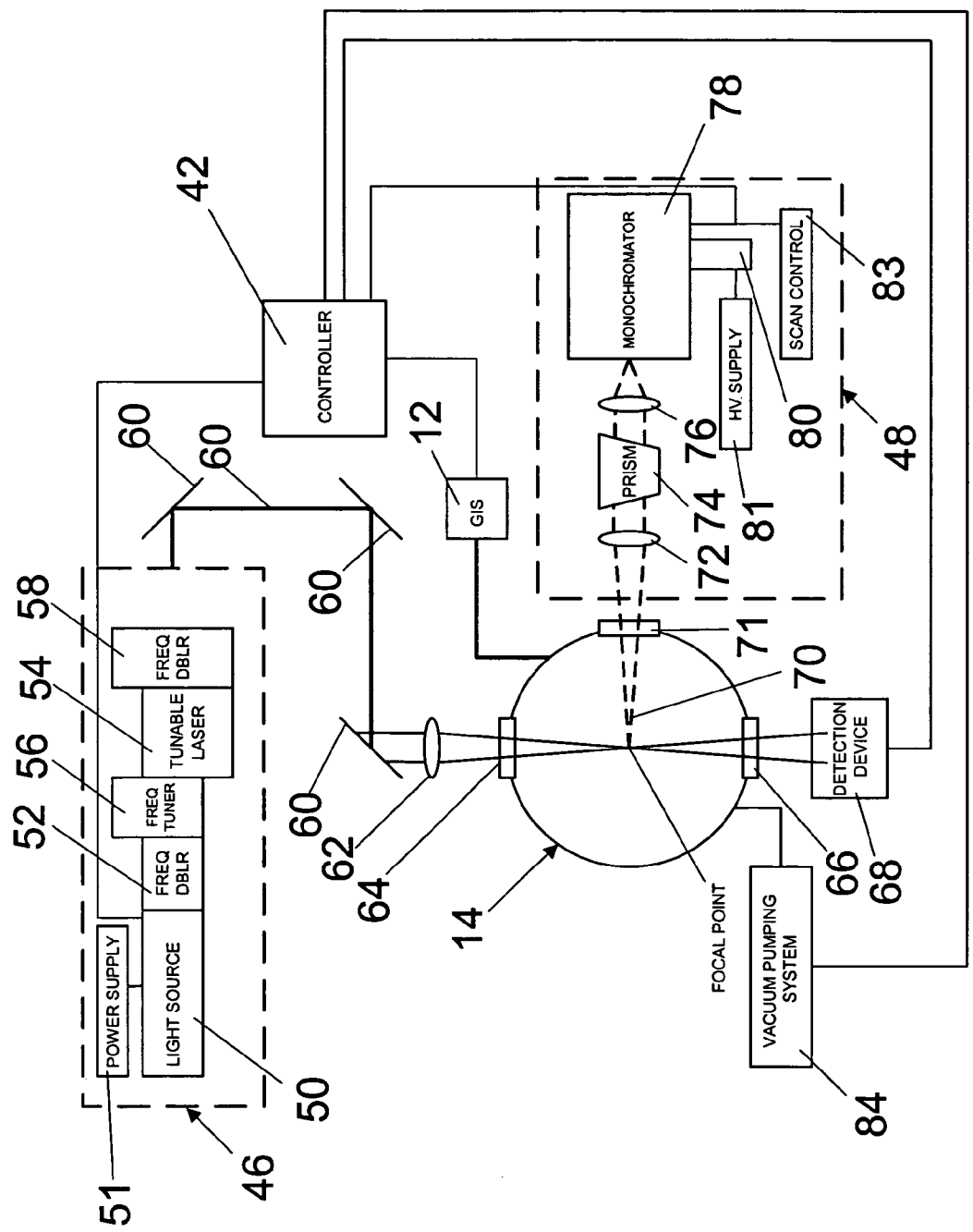
FIG. 7 is a schematic view of an embodiment of a sensor that can be used in a chemical processing system in accordance with the principles of the invention for sensing a mixing rate of first and second process gases.

One example of the sensor 44 is shown in greater detail in FIG. 7. In this embodiment, the sensor 44 is a laser-induced fluorescence (LIF) sensor, but other sensors capable of sensing mixing information of the first and second process gases 26, 34 could be used as well. Using laser-induced fluorescence, direct process gas specie concentration measurement or tracer gas specie concentration measurement can be performed.

FIG. 7 shows the sensor 44 coupled to the processing chamber 14 to monitor a specie concentration of one or more process gases 26, 34 introduced into the processing chamber 14 using the gas injection system 12. The sensor 44 includes an illumination system 46 configured to produce ultraviolet light for illuminating the first and second process gases 26, 34 when the ultraviolet light is passed through the chemical processing region 14. The sensor 44 also includes a detection system 48 configured to detect optical characteristics of the first and second process gases 26, 34.

The illumination system 46 can include a light source 50 which can be, for example, a neodymium (3+)-doped yttrium aluminum garnet pulsed laser (i.e., Nd:YAG laser), to generate high power, fixed wavelength output. An adjustable power supply 51 can supply power to the light source 50, for example. The infrared light output from the light source 50 can be frequency doubled using a frequency doubler 52, which can be an angle-tuned crystal of potassium dihydrogen phosphate (KDP), for example. The resultant green output at 532 nm can be used to pump a wavelength tunable dye laser 54. Pulsed output of the dye laser 54 can be frequency tuned by a frequency tuner 56, for example, which can include selection of laser dyes and use of an intra-cavity grating. The frequency tuner 56 can be a harmonic separator, that can, for example, use mirrors and a grating or prism to spread the laser light and separate frequencies. The tunable laser 54 can include an oscillator and one or more amplifiers configured to increase an intensity of the oscillator output. The output of the tunable laser 54 can be directed into a second frequency doubler 58, which can be an angle-tuned crystal of potassium dihydrogen phosphate (KDP), for example. The frequency doubler 58 can frequency double the visible wavelength light to generate an ultraviolet (UV) light beam. The UV light beam can be selected using a prism or a bandpass filter (not shown), for example, before being directed into the processing chamber 14 by a series of mirrors 60.

From the series of mirrors 60, the UV light beam can pass through a lens 62 to focus the UV light beam in processing chamber 14, for example, in the chemical processing region 16. The UV light beam can pass through a first optical viewport 64 formed in the processing chamber 14. After passing through the focal point, the UV light beam diverges and exits through a second optical viewport 66 formed in the processing chamber 14. A detection device 68, such as a power meter, or a beam dump, for example, can be positioned adjacent the second optical viewport 66 so that the UV light beam can terminate thereon. The detection device 68 can be coupled to the controller 42 to monitor characteristics of the ultraviolet light passing through the chemical processing region thereto.

The detection system 48 can be positioned at a right angle with respect to the UV light beam passing through the processing chamber 14 to collect fluorescence emitted along an optical axis 70 through an optical viewport 71 formed in the processing chamber 14. The detection system 48 can include an optical train 72, for example, which is shown in this embodiment as one lens positioned at exactly one focal length from the focal point of the UV light beam within the processing chamber 14. The optical train 72 collimates the incoherent fluorescence and the collimated emission can be directed into a prism 74. The prism 74 can be a roof prism or other optical element, for example. The prism 74 can be angled with respect to the optical axis 71, for example, to rotate the image of the horizontal laser as desired. For example, the prism 74 can be angled at a 45 degree angle with respect to the optical axis 71, which can rotate the laser beam by 90 degrees, to produce a vertical line image.

The collimated emission is directed from the prism 74 through a second lens 76 to focus the image onto a monochromator 78. The monochromator 78 is configured for wavelength separation of the fluorescence spectrum. Alternatively, a series of bandpass filters can replace the monochromator 78.

Pulsed fluorescence can be detected using a photo-multiplier tube (PMT) 80, the output of which can be collected by the controller 42. The controller 42 can include a boxcar signal averager, for example, to recover one or more signals from accompanying noise. A high voltage supply 81 can be coupled to the PMT 80 to enable adjustment or matching of the PMT gains.

A scan control device 83 can be coupled to the monochromator 78, for example, to allow display, collection and analysis of spectral information within a predetermined scan range. Further details of the LIF system described in FIG. 7 can be obtained from Selwyn, Gary S., 1993, *"Optical Diagnostic Techniques For Plasma Processing"*, AVS Monograph Series, The Education Committee, American Vacuum Society, New York, which is incorporated by reference herein in its entirety.

The measurement of one or more specie concentration, which can be used to determine the mixing rate, can be supplied to the controller 42 from the detection monochromator 78. Power fluctuation can be normalized by the controller 42, for example, by dividing output from the monochromator 78 by the output of the detection device 68. In this manner, the controller 42 can adjust the gas injection system 12 to either increase or decrease process gas mixing. For example, if the specie concentration exceeds the fully mixed value, then one or both of the gas injectors 24, 32 can be adjusted to enhance mixing between the process gases 26, 34 or vice versa. Adjustment may be effected by supplying more or less process gas 26, 34 into the processing chamber 14 as desired, for example.

A vacuum pumping system 84 can be coupled to the processing chamber 14 to produce a desired pressure within the processing chamber 14, for example. The controller 42 can be coupled to the vacuum pumping system 84 to adjust the processing pressure, which can influence the process gas mixing rate.

In the above described embodiment of the sensor 44, the illumination system 46 and the detection system 48 can be translated to provide spatial resolution. In this manner, the focal point of the UV light beam can be moved within the processing chamber 14 when the illumination system 46 and the detection system 48 are translated, for example, such that measurement of one or more specie concentration of the process gases 26, 34 can be effected in a larger area of the processing chamber 14.

FIGS. 8-14 illustrate various alternative embodiments of the gas injector system 12. In each embodiment, elements that are substantially similar or the same as elements shown and described in previously described embodiments will not be further described and will contain a like reference numeral.

Figure 8:
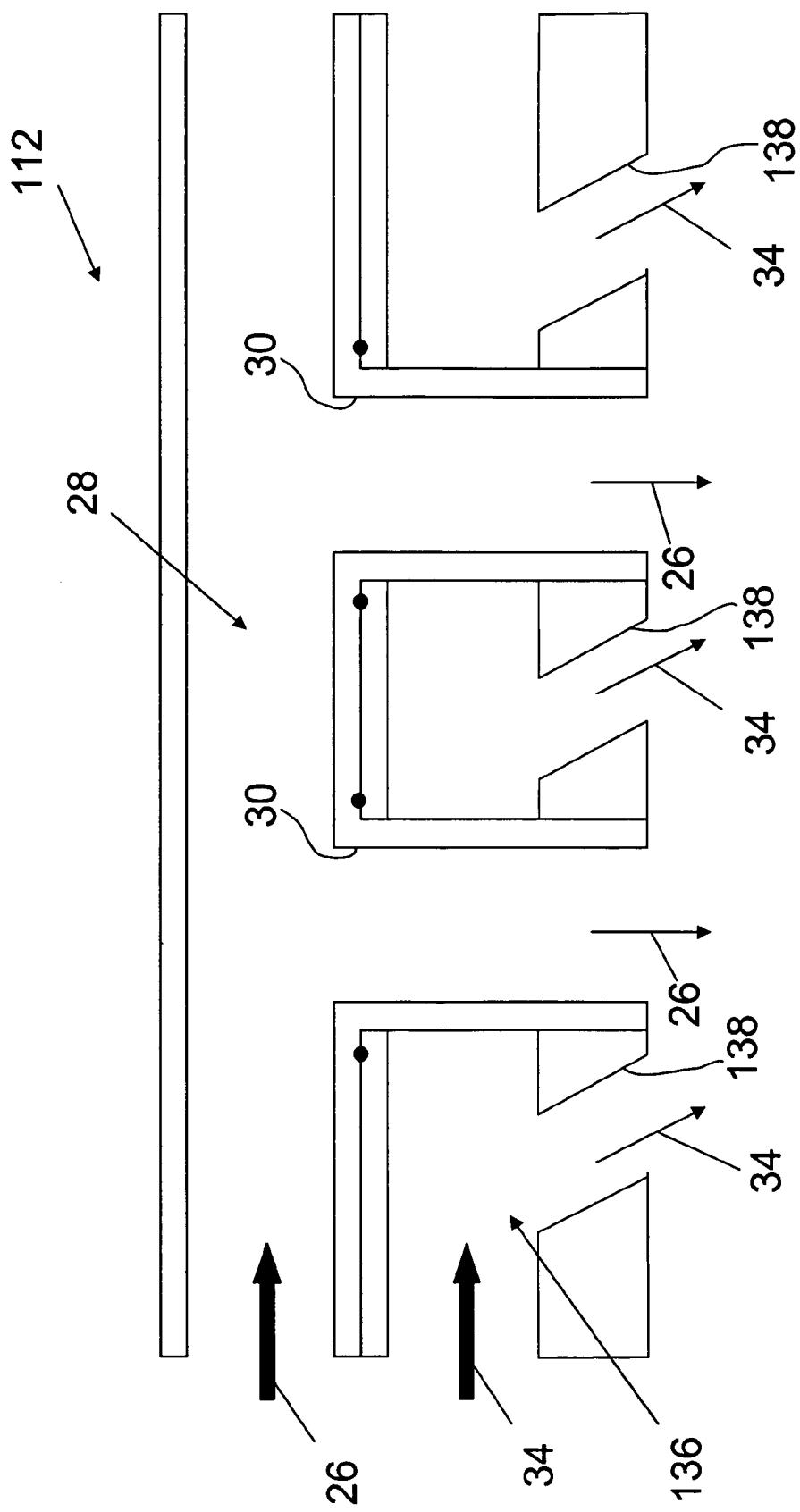
FIG. 8 is a diagrammatic cross section of a fifth embodiment of the gas injection system, which shows one of the first and second pluralities of gas injection orifices angled relative to the other of the first and second pluralities of gas injection orifices.

FIG. 8 shows a gas injector system 112, which operates in a substantially similar manner as the gas injector system 12, but the gas injector system is configured to inject one process gas (first process gas 26, but second process gas 34 can be used instead) in a direction orthogonal to substrate 18 through the orifices 30 described above and is configured to inject the other process gas (second process gas 34, but first process gas 26 can be used instead) angled relative to the one process gas. The other process gas can flow at a non-orthogonal angle relative to the substrate 18 (FIG. 2).

To effect this injection, the gas injector system 112 includes a plurality of gas injection orifices 138 formed in a gas injection plenum or passageway 136. The gas injection orifices 138 can extend between the gas injection plenum or passageway 136 and the chemical processing region 16 at any angle. The gas injection orifices 138, which can be machined, die-cast, molded or manufactured another way, can be formed in the gas injection plenum or passageway 136 or in the gas injection plenum or passageway 36 since the gas injection plenums or passageways 36, 136 can operate in a substantially similar manner.

This injection helps to accelerate the mixing of the first process gas and the second process gas. This configuration of the orifices 138 can increase the mixing rate between the first process gas and the second process gas, which can be used to help control the gas injection system 112.

Figure 9:
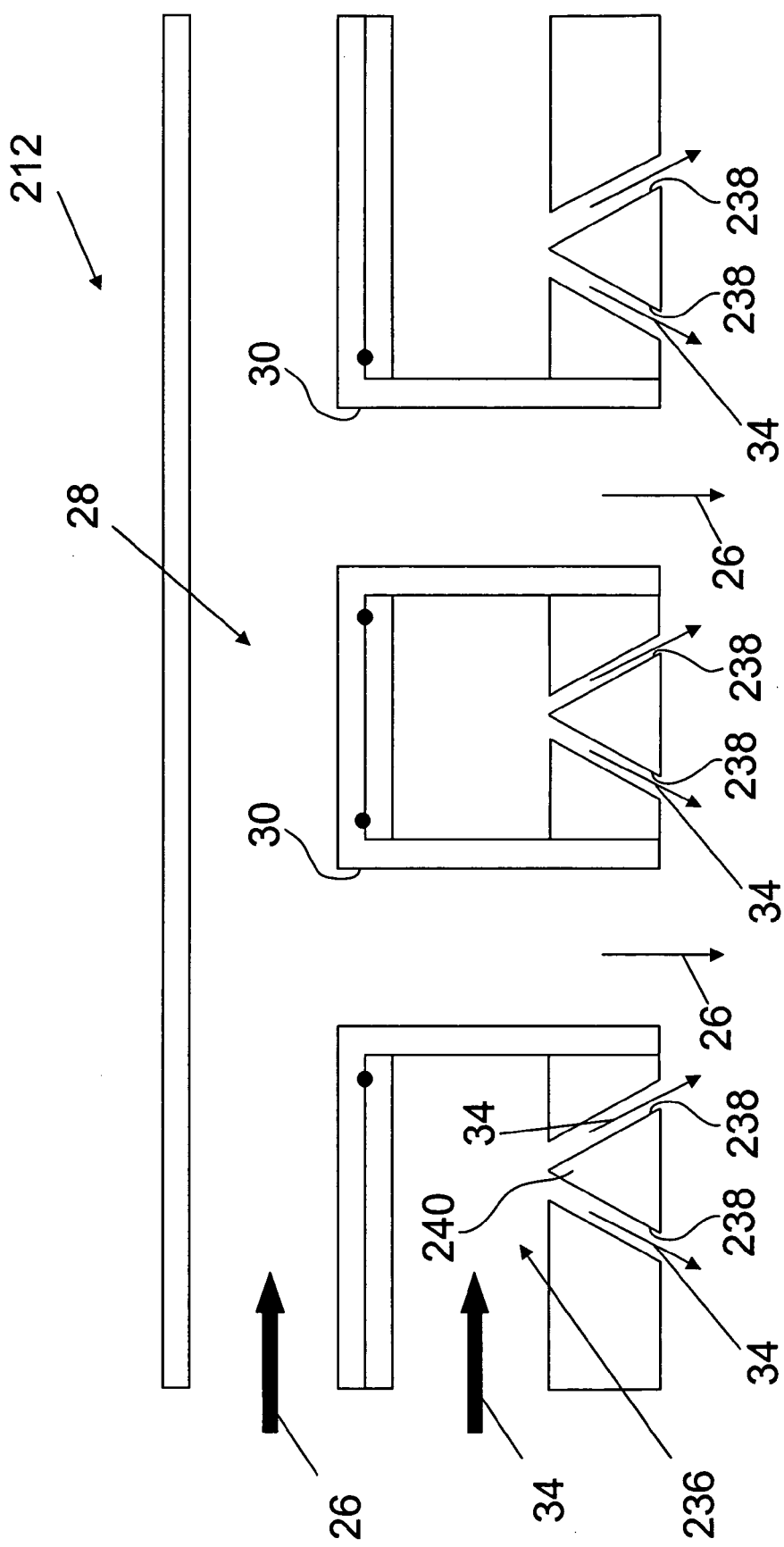
FIG. 9 is a diagrammatic cross section of a sixth embodiment of the gas injection system, which shows gas injection orifices within one of the first and second gas injection pluralities angled relative to one another.

FIG. 9 shows a gas injector system 212, which operates in a substantially similar manner as the gas injector system 112. The gas injector system 212 injects one process gas (second process gas 34, but first process gas 26 can be used as well) in two directions angled relative to the other process gas, which is the first process gas 26, for example.

The gas injector system 212 includes a plurality of gas injection orifices 238 formed in a gas injection plenum or passageway 236. The gas injection plenum or passageway 236 is substantially the same in operation as the gas injection plenum or passageway 136, but differs in construction in that the gas injection orifices 238 have a different configuration than the gas injection orifices 138.

The gas injection orifices 238 can extend between the gas injection plenum or passageway 236 and the chemical processing region 16 at any angle and in this embodiment, the gas injection orifices 238 can have a linear cross-section. To effect the angled injection in two directions, a flow restrictor element 240 can be positioned in each gas injection orifice 238 to create separate flow paths in diverging directions. Each flow path can be angled relative to the elongated orifices 30 for the process gas 34. The flow path is substantially formed by the cross-sectional shape of the flow restrictor element 240, which is substantially triangular in FIG. 9. Alternatively, the flow restrictor element 240 can be substantially pyramidal such that the gas injection orifices 238 can have substantially frusto-conical cross-sections.

The angled injection can accelerate mixing of the first process gas 26 and the second process gas 34 and can allow the first and second process gases 26, 34 to mix together at a high rate. The angles can increase the mixing rate between the first process gas 26 and the second process gas 34, which can be used to help control the gas injection system 212.

Figure 10:
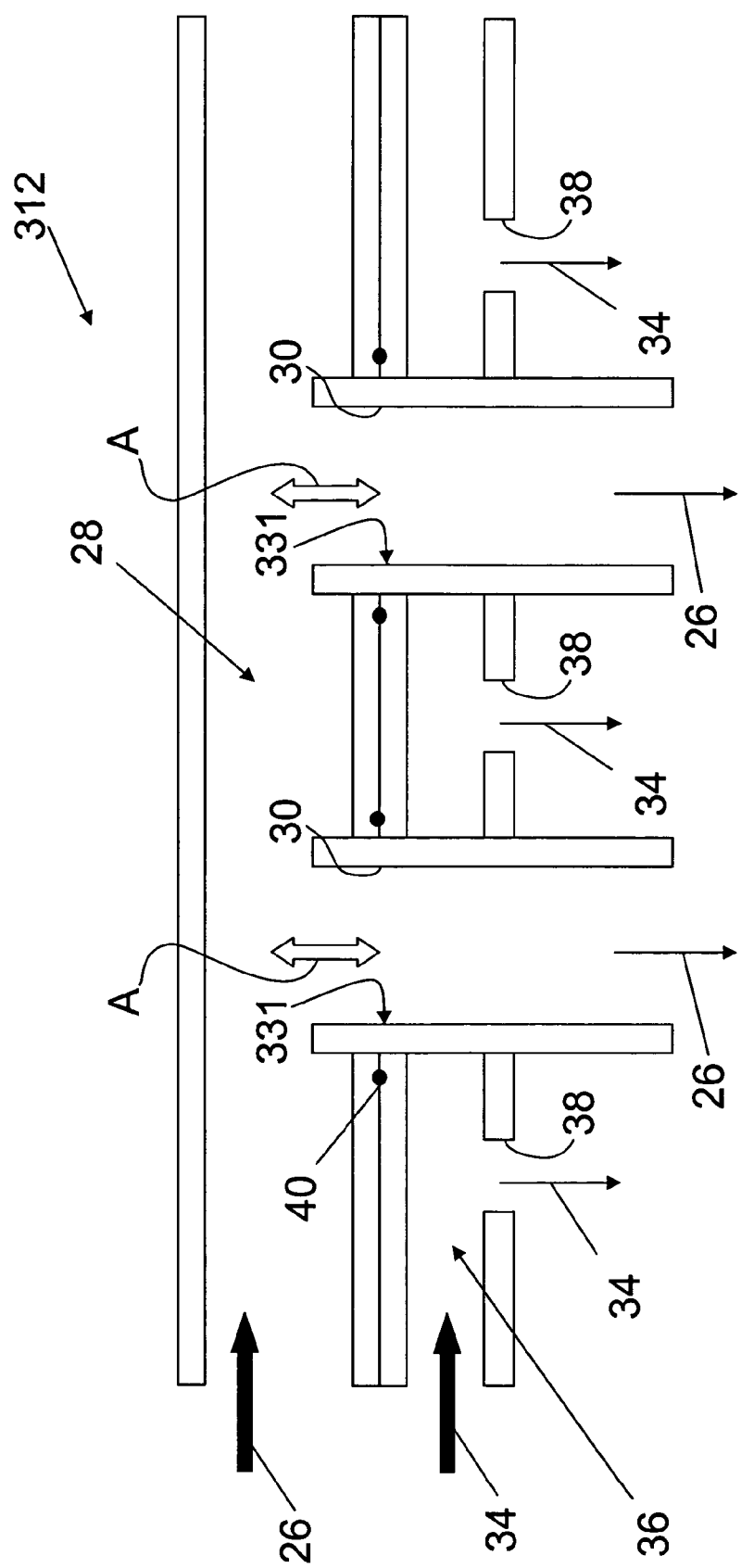
FIG. 10 is a diagrammatic cross section of a seventh embodiment of the gas injection system, which shows a movable shroud coupled to one of the first and second gas injection orifices.

FIG. 10 shows a gas injector system 312, which operates in a substantially similar manner as the gas injector system 12, but includes an elongated shroud 331 that is movable (indicated by double-ended arrowheads A) to adjust the mixing rate of the first and second process gases 26, 34. The elongated shroud 331 extends from the first gas injection plenum 28 through the second gas injection plenum 36 to separate the process gases 26, 34.

For example, in FIG. 10, a movement of the elongated shroud 331 in the direction of gas flow could decrease the degree of mixing of the first and second process gases 26, 34 because a lower portion of the elongated shroud 331 could keep the first and second process gases separate for a longer period of time. Likewise, a movement of the elongated shroud 331 opposite to the direction of gas flow could increase the degree of mixing of the first and second process gases 26, 34.

Any of the shrouds 331 can be oriented at any angle relative to other shrouds or the substrate. Angled shrouds 331 can be moved in a direction opposite gas flow to increase the degree of mixing of the first and second process gases 26, 34 and can be moved in a direction of gas flow to decrease the degree of mixing of the first and second process gases 26, 34.

The elongated shroud 331 can be coupled to a controller, which can be similar to the controller 42 described above, to control movement thereof. The elongated shroud 331 can be moved based on a mixing rate obtained in the chemical processing chamber 16, for example, by using a mixing rate sensor, such as sensor 44 described above. As a result, the movable shroud 331 can be used to adjust the degree of mixing of the first and second process gases 26, 34.

Figure 11:
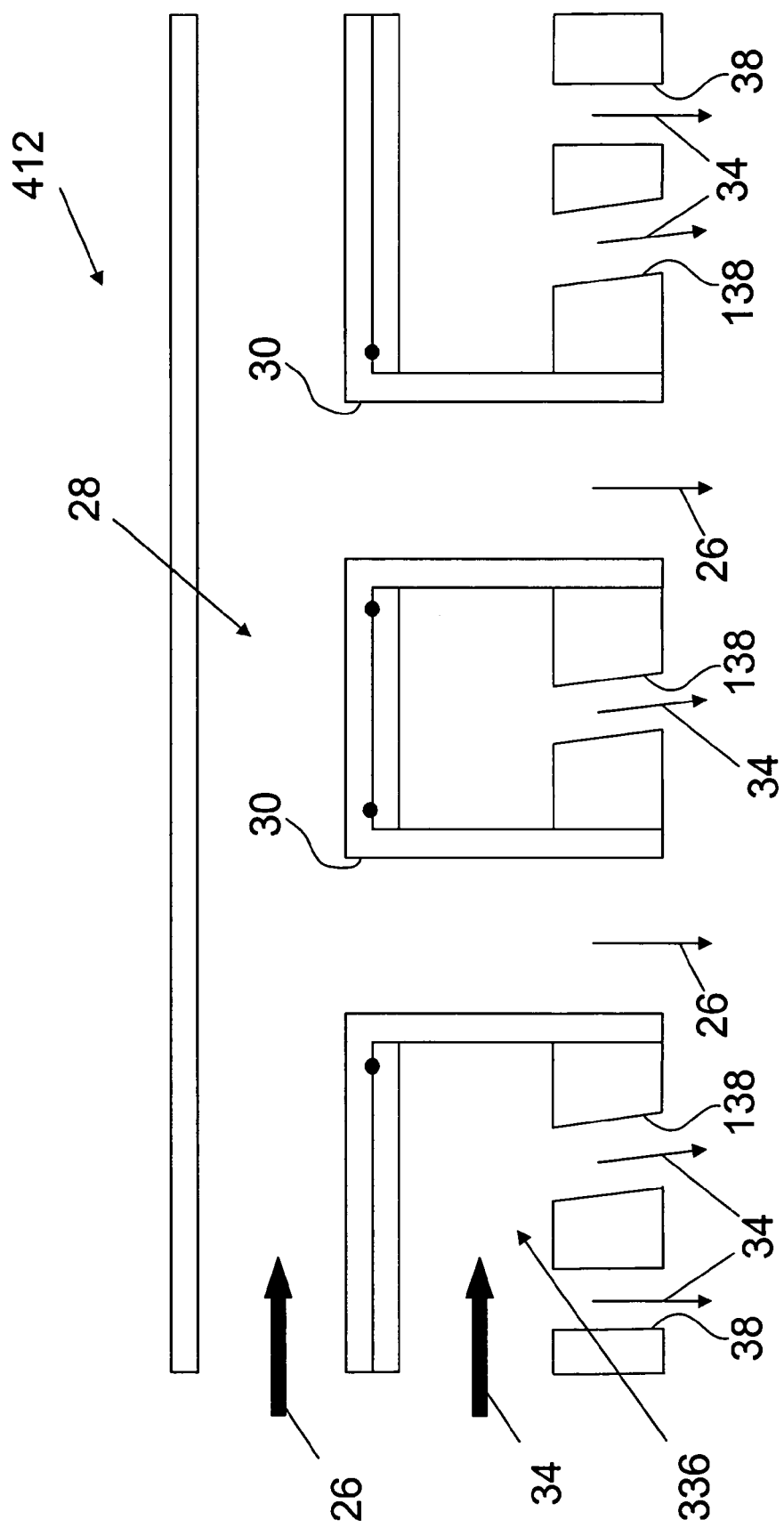
FIG. 11 is a diagrammatic cross section of an eighth embodiment of the gas injection system, which shows gas injection orifices within one of the first and second gas injection pluralities angled relative to and parallel with the other of the first and second pluralities of gas injection orifices.

FIG. 11 shows a gas injector system 412, which operates in a substantially similar manner as the gas injector system 112, but further includes a plurality of gas injection orifices 38 shown in FIGS. 3-6. As a result, the gas injector system 412 can introduce or inject the second process gas 34 into the chemical processing region 16 in both a direction orthogonal to substrate 18 through the orifices 38 and in a direction non-orthogonal to substrate 18 through the orifices 138, for example.

The different angles of injection cooperate to accelerate mixing of the first process gas 26 and the second process gas 34 as compared to one injection angle alone. The different angles of injection can increase the mixing rate between the first process gas 26 and the second process gas 34, which can be used to help control the gas injection system 412.

Figure 12:
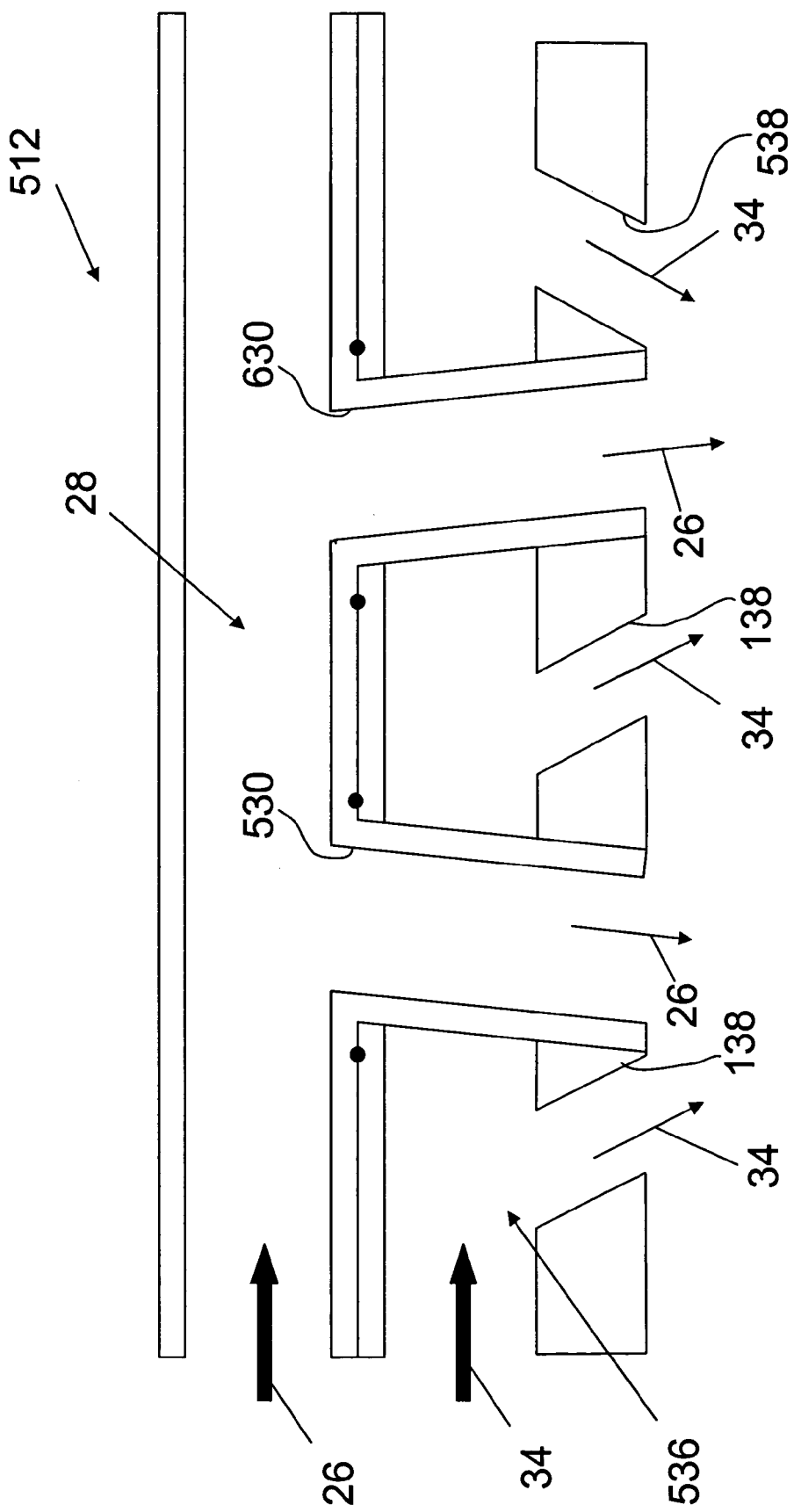
FIG. 12 is a diagrammatic cross section of a ninth embodiment of the gas injection system, which shows gas injection orifices within one of the first and second gas injection pluralities angled relative to one another.

FIG. 12 shows a gas injector system 512, which operates in a substantially similar manner as the gas injector system 12, but the gas injector system is configured to inject one process gas (first process gas 26, but second process gas 34 can be used instead) at different angles through orifices 530, 630 respectively, and is configured to inject the other process gas (second process gas 34, but first process gas 26 can be used instead) angled relative to the one process gas at different angles. In this embodiment, the one process gas and the other process gas can flow at a non-orthogonal angles relative to the substrate 18 (FIG. 2).

To effect this injection, the gas injector system 512 includes a plurality of gas injection orifices 138, 538 formed in a gas injection plenum or passageway 536. The gas injection orifices 138, 538 can extend between the gas injection plenum or passageway 536 and the chemical processing region 16 at any angle. The gas injection orifices 138, 538, which can be machined, die-cast, molded or manufactured another way, can be formed in the gas injection plenum or passageway 536 or in the gas injection plenum or passageways 36, 136 since the gas injection plenums or passageways 36, 136, 536 can operate in a substantially similar manner.

The angled injection effected at different angles through the gas injection orifices 138, 538 and through orifices 530, 630 can help to accelerate the mixing of the first process gas and the second process gas. For example, orifice 530 is angled at a different angle than orifice 630 and orifices 138 are angled a different angles than orifice 538. The angled configuration of the orifices 138, 538, 530, 630 can increase the mixing rate between the first process gas and the second process gas, which can be used to help control the gas injection system 512.

Figure 13:
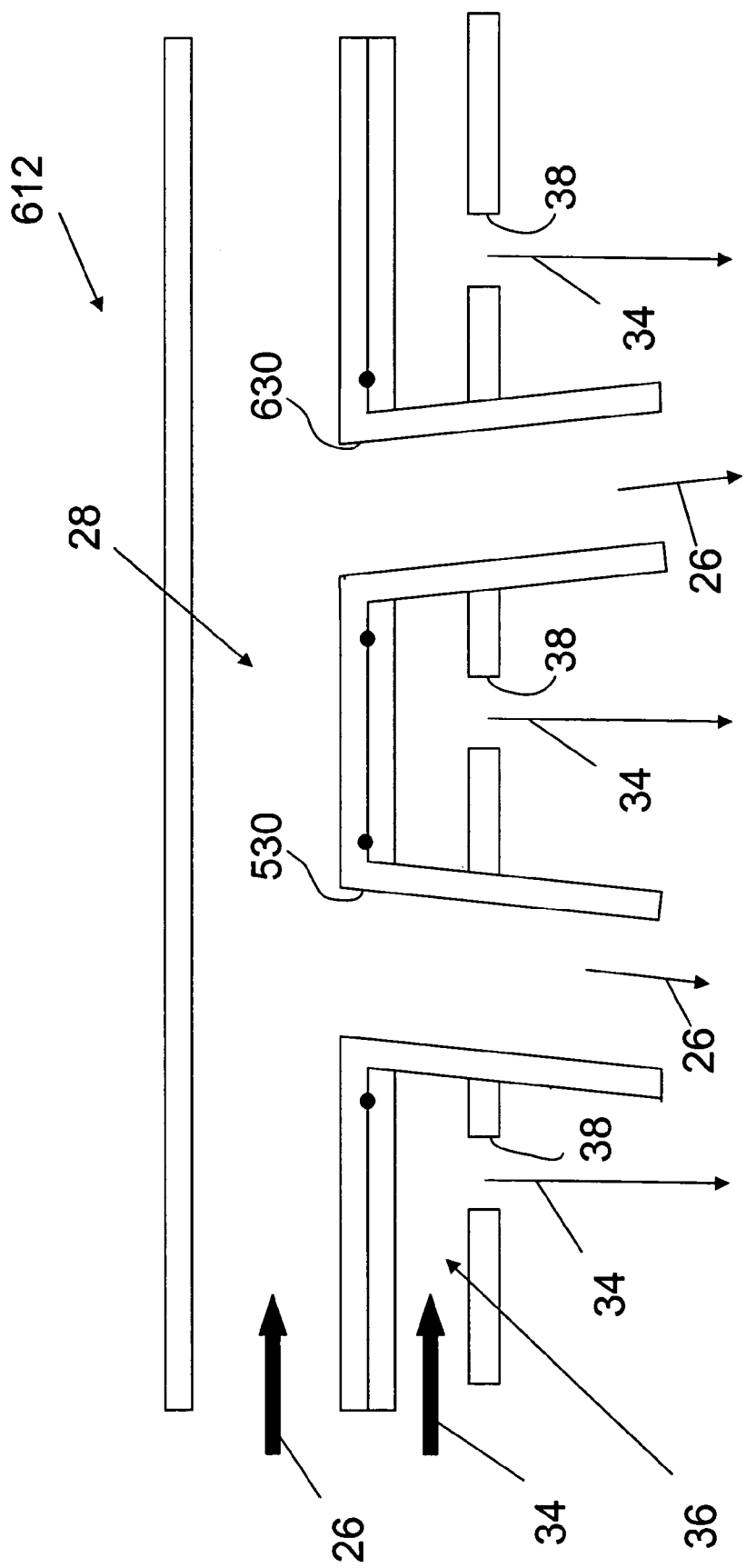
FIG. 13 is a diagrammatic cross section of a tenth embodiment of the gas injection system, which shows gas injection orifices within one of the first and second gas injection pluralities angled relative to one another.

FIG. 13 shows a gas injector system 612, which operates in a substantially similar manner as the gas injector system 12, but the gas injector system is configured to inject one process gas (first process gas 26, but second process gas 34 can be used instead) at different angles through orifices 530, 630 respectively, and is configured to inject the other process gas (second process gas 34, but first process gas 26 can be used instead) in a direction orthogonal to substrate 18. The one process gas can flow at a non-orthogonal angle relative to the substrate 18 (FIG. 2).

To effect this injection, the gas injector system 612 includes a plurality of gas injection orifices 38 described above formed in a gas injection plenum or passageway 36. The gas injection orifices 38 can extend between the gas injection plenum or passageway 36 and the chemical processing region 16 in a direction orthogonal to substrate 18 as shown, or at any angle. The gas injection orifices 38, which can be machined, die-cast, molded or manufactured another way, can be formed in the gas injection plenum or passageway 36 or in the gas injection plenum or passageway 136 since the gas injection plenums or passageways 36, 136 can operate in a substantially similar manner.

The angled injection effected at different angles through the angled gas injection orifices 530, 630 can help to accelerate the mixing of the first process gas and the second process gas. For example, orifice 530 is angled at a different angle than orifice 630 and both orifices 530, 630 are angled relative to the orifices 38. The angled configuration of the orifices 530, 630 can increase the mixing rate between the first process gas and the second process gas, which can be used to help control the gas injection system 612.

Figure 14:
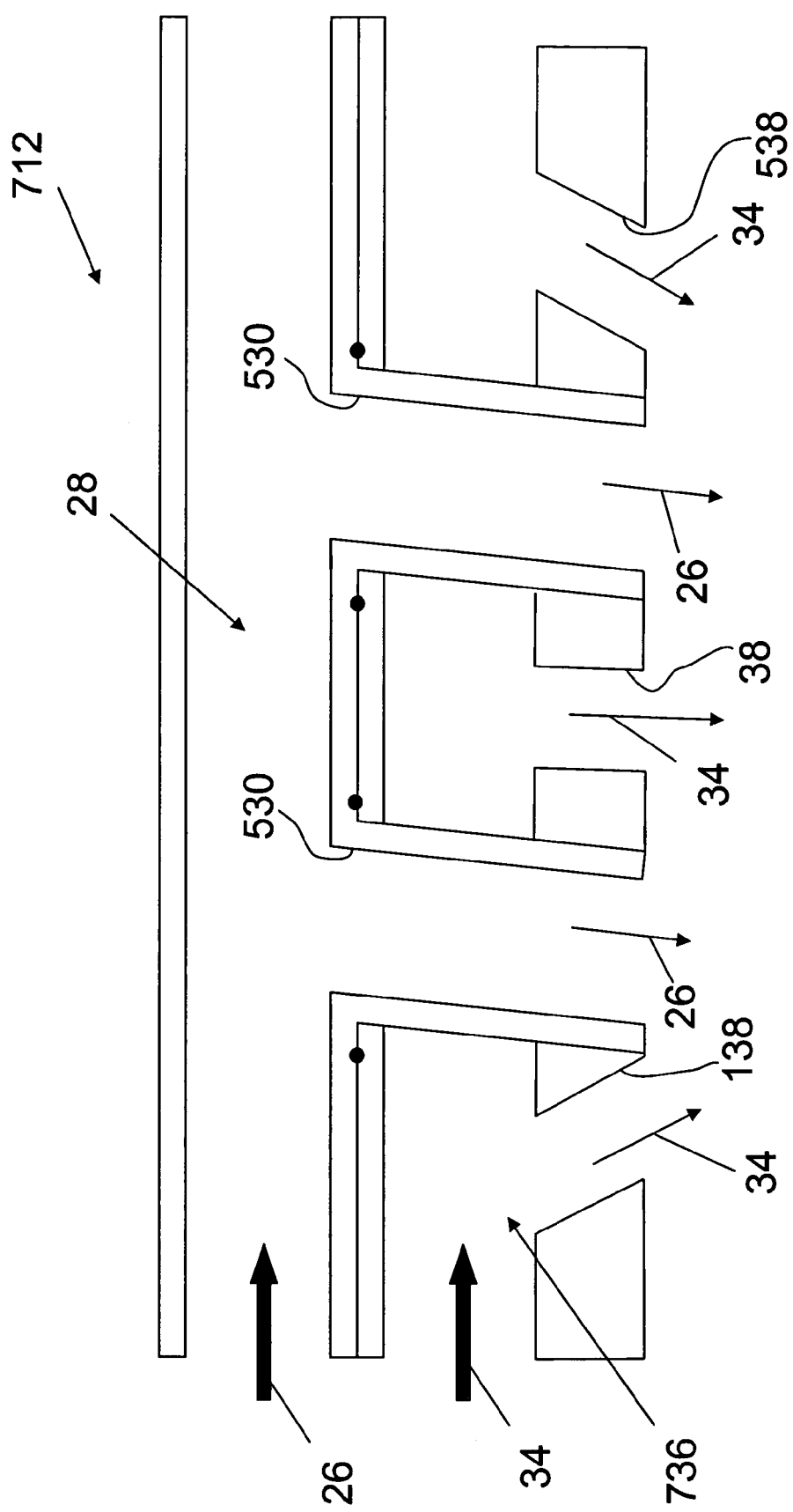
FIG. 14 is a diagrammatic cross section of an eleventh embodiment of the gas injection system, which shows gas injection orifices within one of the first and second gas injection pluralities angled relative to one another.

FIG. 14 shows a gas injector system 712, which operates in a substantially similar manner as the gas injector system 12, but the gas injector system is configured to inject one process gas (first process gas 26, but second process gas 34 can be used instead) at an angle non-orthogonal to substrate 18 through orifices 530 and is configured to inject the other process gas (second process gas 34, but first process gas 26 can be used instead) in directions both orthogonal and non-orthogonal to substrate 18. The one process gas and the other process gas can flow at a non-orthogonal angles relative to the substrate 18 (FIG. 2).

To effect the angled injection, the gas injector system 712 includes a plurality of gas injection orifices 38, 138, 538 described above formed in a gas injection plenum or passageway 736. The gas injection orifices 38 can extend between the gas injection plenum or passageway 736 and the chemical processing region 16 in a direction orthogonal to substrate 18 while the gas injection orifices 138, 538 can extend between the gas injection plenum or passageway 736 and the chemical processing region 16 at different angles. The gas injection orifices 38, 138, 538, which can be machined, die-cast, molded or manufactured another way, can be formed in the gas injection plenum or passageway 736 or in the gas injection plenum or passageways 36, 136 since the gas injection plenums or passageways 36, 136, 736 can operate in a substantially similar manner.

The angled injection effected at different angles through the angled gas injection orifices 530 and through the orifices 38, 138, 538 can help to accelerate the mixing of the first process gas and the second process gas. For example, orifices 530 are angled at a different angle than the orifices 38, 138, 538. The angled configuration of the orifices 530, 38, 138, 538 can increase the mixing rate between the first process gas and the second process gas, which can be used to help control the gas injection system 712.

Figure 15:
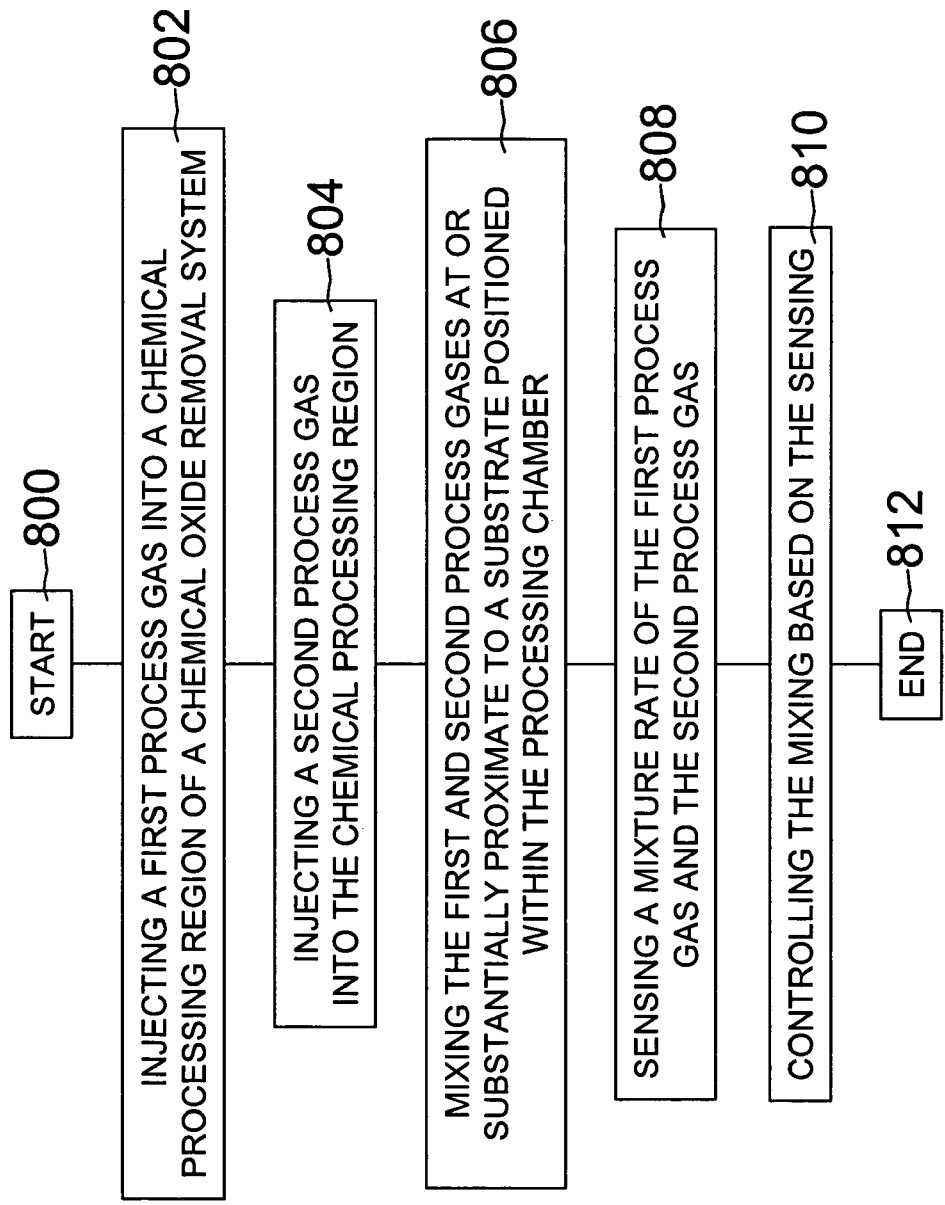
FIG. 15 is a flow chart showing a method of mixing process gas in a chemical processing region of a chemical processing system in accordance with principles of the invention.

FIG. 15 shows a method in accordance with principles of the invention. The method is for mixing process gas in a chemical processing region of a chemical processing system. The chemical processing system includes a processing chamber containing the chemical processing region.

The method starts at 800. At 802 and 804, a supply of first process gas and a supply of second process gas are injected into the chemical processing region, respectively. Any of the above described gas injection systems 12, 112, 212, 312, 412, 512, 612 or 712 can be used to inject the first and second process gases. At 806, the first and second process gases are mixed at or substantially proximate to a substrate to be processed, which is positioned within the chemical processing region. At 808, a mixture rate of the first process gas and the second process gas is sensed with a sensor, for example. The sensor can be capable of performing laser induced fluorescence or an alternative method to sense the mixture rate of the first and second process gases. At 810, the mixing is controlled based on the sensed mixture rate. The mixture rate can be sensed in real time, which also allows the mixing to be controlled in real time. The controlling can include adjusting the injection of the first or second process gas into the chemical processing region, adjusting the sensor or adjusting components of the chemical processing system, for example. At 812, the method ends.

Various combinations of these additional acts, operations or procedures could be used as well. For example, the controlling can include adjusting the injection of the first process gas into the chemical processing region, adjusting the injection of the second process gas into the chemical processing region or adjusting both the injection of the first and second process gas into the chemical processing region. Such injection adjustments can affect the mixture rate and any further adjustments can be obtained and controlled in real time. Alternatively, the gas injection systems can be passive, with no control.

While the present invention has been particularly shown and described with reference to the preferred embodiments thereof, it will be understood by those skilled in the art that various changes in form and details can be made therein without departing from the spirit and scope of the invention.

For example, the gas injection systems described above can be used with any processing system in which there is at least a chemical treatment process in which at least two process gases are injected into a processing chamber. Also, more than two gas injectors can be used, for example, to inject more than two process gases although only two gas injectors are described in the above embodiments. Any number of the gas injection orifices 30, 38, 138, 238 and 538 can be provided in a respective plenum or passageway in communication with the chemical processing region 16.

Thus, the foregoing embodiments have been shown and described for the purpose of illustrating the functional and structural principles of this invention and are subject to change without departure from such principles. Therefore, this invention includes all modifications encompassed within the spirit and scope of the following claims.

What is claimed is:

1. A chemical processing system, comprising:
   a processing chamber containing a chemical processing region;
   a gas injection system configured to inject process gas into the chemical processing region,
   the gas injection system comprising
      a first process gas injector including at least one first gas injection orifice therein in communication with the chemical processing region;
      the first process gas injector being configured to inject the first process gas into the chemical processing region through the at least one first gas injection orifice to allow exposure of a substrate to the first process gas;
      a second process gas injector including at least one second gas injection orifice therein in communication with the chemical processing region;
      the second process gas injector being configured to inject the second process gas into the chemical processing region through the at least one second gas injection orifice to allow exposure of the substrate to the second process gas; and
      at least one gas injection shroud coupled to at least one of the first gas injection orifice and the second gas injection orifice, wherein the first and second gas injection orifices are angled relative to each other, and the at least one gas injection shroud is movable with respect to the at least one of the first gas injection orifice and the second gas injection orifice.

2. The chemical processing system as in claim 1, further comprising a gas injection controller configured to control the first process gas injector and the second process gas injector.

3. The chemical processing system as in claim 1, wherein the at least one first gas injection orifice is at a non-orthogonal angle relative to the substrate.

4. The chemical processing system as in claim 1, wherein the at least one first gas injection orifice is at a first non-orthogonal angle relative to the substrate and wherein the at least one second gas injection orifice is at a second non-orthogonal angle relative to the substrate, the first non-orthogonal angle being different from the second non-orthogonal angle.

5. The chemical processing system as in claim 4, wherein the at least one second gas injection orifice includes at least two gas injection orifices, wherein one of the at least two gas injection orifices is angled relative to the other of the at least two gas injection orifices and wherein the at least two gas injection orifices are angled relative to the at least one first gas injection orifice.

6. The chemical processing system as in claim 5, wherein the at least two gas injection orifices are angled at different angles relative to the at least one first gas injection orifice.

7. The chemical processing system as in claim 1, wherein the at least one second gas injection orifice includes at least two gas injection orifices, wherein one of the at least two gas injection orifices is angled relative to the at least one first gas injection orifice and wherein the other of the at least two gas injection orifices is substantially parallel to the at least one first gas injection orifice.

8. The chemical processing system as in claim 1, wherein the first process gas includes hydrogen fluoride and the second process gas includes ammonia.

9. The chemical processing system as in claim 1, wherein the first gas injector includes a shroud that defines at least a portion of the at least one first gas injection orifice therein.

10. The chemical processing system as in claim 9, wherein the shroud is movable to adjust a degree of mixing of the first and second process gases.

11. The chemical processing system as in claim 1, further comprising a sensor configured to sense a mixing rate of the first and second process gases.

12. The chemical processing system as in claim 11, wherein the first gas injector includes a shroud that defines at least a portion of the at least one first gas injection orifice therein and wherein the shroud is movable based on the sensed mixing rate to adjust the degree of mixing of the first and second process gases.

13. A chemical processing system, comprising:
a processing chamber containing a chemical processing region;
a gas injection system configured to inject a first process gas and a second process gas into the chemical processing region,
the gas injection system comprising a gas distribution assembly including
a first gas distribution plate defining a first gas injection plenum and a first plurality of gas injection orifices therein, the first gas injection plenum and the first plurality of gas injection orifices being in communication with the chemical processing region; and
a second gas distribution plate defining a second gas injection plenum and a second plurality of gas injection orifices therein, the second gas injection plenum and the second plurality of gas injection orifices being in communication with the chemical processing region,
wherein at least one of the first plurality of gas injection orifices and at least one of the second plurality of gas injection orifices are angled relative to each other, and
wherein the first gas injection plenum is configured to receive the first process gas and wherein the second gas injection plenum is configured to receive the second process gas such that exposure of a substrate positioned within the chemical processing region to the mixed first and second process gases can be effected through the first and second pluralities of gas injection orifices
wherein the chemical processing system further comprises a shroud that defines a portion of the first plurality of gas injection orifices; and wherein the shroud is movable to adjust a degree of mixing of the first and second process gases.

14. The chemical processing system as in claim 13, further comprising a first process gas injector coupled to the first gas injection plenum and configured to inject the first process gas into the first gas injection plenum through the first plurality of gas injection orifices and a second process gas injector coupled to the second gas injection plenum and configured to inject the second process gas into the second process gas injection plenum.

15. The chemical processing system as in claim 13, further comprising a sensor configured to sense a mixing rate of the first and second process gases within the chemical processing region.

16. The chemical processing system as in claim 15, wherein the sensor includes a laser induced fluorescence system.

17. The chemical processing system as in claim 16, wherein the laser induced fluorescence system includes an illumination system configured to produce ultraviolet light for illuminating the first and second process gases when the ultraviolet light is passed through the chemical processing region and a detection system configured to detect optical characteristics of the first and second process gases.

18. The chemical processing system as in claim 17, further comprising a detection device configured to measure characteristics of the ultraviolet light passing through the chemical processing region.

19. The chemical processing system as in claim 18, further comprising a controller coupled to the illumination system and the detection device, the controller being configured to receive information about the characteristics of the ultraviolet light from the detection device and to receive information about the optical characteristics of the first and second process gases from the detection system to control a mixing rate of the first and second process gases.

20. The chemical processing system as in claim 19, wherein the controller is configured to adjust at least one of the illumination system and the gas injection system based on the characteristics of the ultraviolet light or the optical characteristics of the first and second process gases.

21. The chemical processing system as in claim 13, wherein the gas distribution assembly includes a plurality of components.

22. The chemical processing system as in claim 13, wherein the first plurality of gas injection orifices is at a first non-orthogonal angle relative to the substrate and wherein the second plurality of gas injection orifices is at a second non-orthogonal angle relative to the substrate, the first non-orthogonal angle being different from the second non-orthogonal angle.

23. The chemical processing system as in claim 13, wherein the second plurality of gas injection orifices includes at least two gas injection orifices, wherein one of the at least two gas injection orifices is angled relative to the other of the at least two gas injection orifices and wherein the at least two gas injection orifices are angled relative to the first plurality of gas injection orifices.

24. The chemical processing system as in claim 23, wherein the at least two gas injection orifices are angled at different angles relative to the first plurality of gas injection orifices.

25. The chemical processing system as in claim 13, wherein the second plurality of gas injection orifices includes at least two gas injection orifices, wherein one of the at least two gas injection orifices is angled relative to the first plurality of gas injection orifices and wherein the other of the at least two gas injection orifices is substantially parallel to the first plurality of gas injection orifices.

26. The chemical processing system as in claim 13, wherein the first process gas includes hydrogen fluoride and the second process gas includes ammonia.

27. The chemical processing system as in claim 13, further comprising a sensor configured to sense a mixing rate of the first and second process gases within the chemical processing region, wherein the shroud is movable based on the sensed mixing rate to adjust the degree of mixing of the first and second process gases.

28. The chemical processing system as in claim 27, wherein the sensor includes a laser induced fluorescence system.

29. A chemical processing system, comprising:
a processing chamber containing a chemical processing region;
a gas injection system configured to inject a first process gas and a second process gas into the chemical processing region,
the gas injection system comprising a gas distribution assembly including
a first gas injector including at least one first gas injection orifice therein, the at least one first gas injector orifice being in communication with the chemical processing region, and
a second gas injector including at least one second gas injection orifice therein, the at least one second gas injector orifice being in communication with the chemical processing region,
wherein the first gas injector is configured to receive the first process gas and wherein the second gas injector is configured to receive the second process gas such that exposure of a substrate positioned within the chemical processing region to the mixed first and second process gases can be effected through the first and second gas injection orifices; and
a shroud in communication with the chemical processing region, the
shroud defining a portion of the at least one first gas injection orifice
wherein the shroud is movable to adjust a degree of mixing of the first and second process gases.

30. The chemical processing system as in claim 29, further comprising a sensor configured to sense a mixing rate of the first and second process gases within the chemical processing region.

31. The chemical processing system as in claim 30, wherein the shroud is movable based on the sensed mixing rate such that a movement in a direction of gas flow decreases the degree of mixing of the first and second process gases and a movement in a direction opposite gas flow increases the degree of mixing of the first and second process gases.

32. A chemical processing system, comprising:
a processing chamber containing a chemical processing region;
a gas injection system configured to inject process gas into the chemical processing region,
the gas injection system comprising
a first process gas injector including at least one gas injection orifice in communication with the chemical processing region,
the first process gas injector being configured to inject the first process gas into the chemical processing region to allow exposure of the substrate to the first process gas, and
a second process gas injector including at least one second gas injection orifice in communication with the chemical processing region,
the second process gas injector being configured to inject the second process gas into the chemical processing region to allow exposure of the substrate to the second process gas;
a sensor configured to sense a mixing rate of the first and second process gases within the chemical processing region, and
a shroud that defines a portion of the at least one first gas injection orifice,
wherein the shroud is movable to adjust a degree of mixing of the first and second process gases.

33. The chemical processing system as in claim 32, wherein the sensor includes a laser induced fluorescence system.

34. The chemical processing system as in claim 33, wherein the laser induced fluorescence system includes an illumination system configured to produce ultraviolet light for illuminating the first and second process gases when the ultraviolet light is passed through the chemical processing region and a detection system configured to detect optical characteristics of the first and second process gases.

35. The chemical processing system as in claim 34, further comprising a detection device configured to measure characteristics of the ultraviolet light passing through the chemical processing region.

36. The chemical processing system as in claim 35, further comprising a controller coupled to the illumination system and the detection device, the controller being configured to receive information about the characteristics of the ultraviolet light from the detection device and to receive information about the optical characteristics of the first and second process gases from the detection system to control a mixing rate of the first and second process gases.

37. The chemical processing system as in claim 36, wherein the controller is configured to adjust the at least one of the illumination system and the gas injection system based on the characteristics of the ultraviolet light or the optical characteristics of the first and second process gases.

38. The chemical processing system as in claim 32, wherein the at least one first gas injection orifice is angled relative to the at least one second gas injection orifice.

39. The chemical processing system as in claim 32, wherein the at least one second gas injection orifice includes at least two gas injection orifices, wherein one of the at least two gas injection orifices is angled relative to the other of the at least two gas injection orifices.

40. The chemical processing system as in claim 39, wherein the at least two gas injection orifices are angled at different angles relative to the at least one first gas injection orifice.

41. The chemical processing system as in claim 32, wherein the at least one second gas injection orifice includes at least two gas injection orifices, wherein one of the at least two gas injection orifices is angled relative to the at least one first gas injection orifice and wherein the other of the at least two gas injection orifices is substantially parallel to the at least one first gas injection orifice.

42. The chemical processing system as in claim 32, wherein the first process gas includes hydrogen fluoride and the second process gas includes ammonia.

43. The chemical processing system as in claim 32, wherein the shroud is movable based on the sensed mixing rate to adjust the degree of mixing of the first and second process gases.

44. The chemical processing system as in claim 43, wherein the sensor includes a laser induced fluorescence system.

* * * * *